US012300769B2

(12) United States Patent
Yoo et al.

(10) Patent No.: US 12,300,769 B2
(45) Date of Patent: May 13, 2025

(54) LIGHT EMITTING ELEMENT, MANUFACTURING METHOD OF SAME, AND DISPLAY DEVICE

(71) Applicant: Samsung Display Co., LTD., Yongin-si (KR)

(72) Inventors: Je Won Yoo, Bucheon-si (KR); Dae Hyun Kim, Hwaseong-si (KR); Xin Xing Li, Suwon-si (KR); Bek Hyun Lim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 688 days.

(21) Appl. No.: 17/597,300

(22) PCT Filed: Jun. 3, 2020

(86) PCT No.: PCT/KR2020/007228
§ 371 (c)(1),
(2) Date: Dec. 30, 2021

(87) PCT Pub. No.: WO2021/002598
PCT Pub. Date: Jan. 7, 2021

(65) Prior Publication Data
US 2022/0320381 A1      Oct. 6, 2022

(30) Foreign Application Priority Data
Jul. 2, 2019   (KR) .................. 10-2019-0079398

(51) Int. Cl.
*H01L 33/50*   (2010.01)
*H01L 27/15*   (2006.01)
(Continued)

(52) U.S. Cl.
CPC .......... *H01L 33/502* (2013.01); *H01L 27/156* (2013.01); *H01L 33/005* (2013.01);
(Continued)

(58) Field of Classification Search
CPC ..... H01L 33/502; H01L 27/156; H01L 33/20; H01L 33/382; H01L 2933/0041;
(Continued)

(56) References Cited

U.S. PATENT DOCUMENTS

| 2012/0132888 A1 | 5/2012 | Kwak et al. |
| 2015/0117052 A1 | 4/2015 | Hsu |

(Continued)

FOREIGN PATENT DOCUMENTS

| CN | 103443942 A | 12/2013 |
| CN | 107731972 A | 2/2018 |

(Continued)

OTHER PUBLICATIONS

Japanese Office Action dated Feb. 27, 2024 regarding Japanese Patent Application No. 2021-577649 corresponding to U.S. Appl. No. 17/597,300 (6 pages).

(Continued)

*Primary Examiner* — Thanh Y. Tran
(74) *Attorney, Agent, or Firm* — Womble Bond Dickinson (US) LLP

(57) ABSTRACT

A light emitting element includes: a first semiconductor layer and a second semiconductor layer; an active layer between the first semiconductor layer and the second semiconductor layer; an insulating film around side surfaces of at least the active layer; and a wavelength conversion material on at least a portion of the insulating film, wherein light emitted to the outside and light emitted from the active layer have different central wavelength bands.

16 Claims, 25 Drawing Sheets

(51) Int. Cl.
*H01L 33/00* (2010.01)
*H01L 33/20* (2010.01)
*H01L 33/38* (2010.01)

(52) U.S. Cl.
CPC ............ *H01L 33/20* (2013.01); *H01L 33/382* (2013.01); *H01L 2933/0041* (2013.01)

(58) Field of Classification Search
CPC ... H01L 25/167; H01L 25/0753; H01L 33/24; H01L 33/504; H01L 33/06; H01L 33/36
See application file for complete search history.

(56) References Cited

U.S. PATENT DOCUMENTS

| | | |
|---|---|---|
| 2016/0126412 A1 | 5/2016 | Hwang |
| 2016/0172339 A1 | 6/2016 | Do |
| 2016/0211245 A1 | 7/2016 | Do |
| 2017/0186819 A1 | 6/2017 | Yun et al. |
| 2017/0236866 A1 | 8/2017 | Lee et al. |
| 2017/0317228 A1 | 11/2017 | Sung |
| 2019/0252579 A1 | 8/2019 | Choi et al. |
| 2022/0320365 A1* | 10/2022 | Ryu ............... H01L 33/24 |
| 2022/0336527 A1* | 10/2022 | Cha ............... H01L 33/24 |
| 2022/0367756 A1* | 11/2022 | Lee ............... H01L 33/44 |
| 2022/0376144 A1* | 11/2022 | An ............... H01L 24/24 |
| 2023/0282777 A1* | 9/2023 | Moon ............... H01L 33/62 257/79 |

FOREIGN PATENT DOCUMENTS

| | | |
|---|---|---|
| JP | 2007-501525 A | 1/2007 |
| JP | 2009-76896 | 4/2009 |
| JP | 2009-231305 | 10/2009 |
| JP | 2011-86865 | 4/2011 |
| JP | 2018-503258 | 2/2018 |
| JP | 2018-137281 A | 8/2018 |
| KR | 2011-0014521 A | 2/2011 |
| KR | 2011-0102061 A | 9/2011 |
| KR | 2012-0122159 A | 11/2012 |
| KR | 2017-0010132 A | 1/2017 |
| KR | 2017-0077929 A | 7/2017 |
| KR | 2017-0095418 A | 8/2017 |
| KR | 10-1782889 B1 | 9/2017 |
| KR | 2018-0003246 A | 1/2018 |
| KR | 2018-0051006 A | 5/2018 |
| KR | 2020-0005711 A | 1/2020 |
| KR | 2020-0017013 A | 2/2020 |
| KR | 2020-0034904 A | 4/2020 |
| WO | WO 2007-097242 A1 | 8/2007 |
| WO | WO 2012/132236 A1 | 10/2012 |
| WO | WO 2016-104401 A1 | 6/2016 |
| WO | WO 2018-001911 A1 | 1/2018 |
| WO | WO 2016-159366 A1 | 2/2018 |

OTHER PUBLICATIONS

Chinese Office Action dated Jun. 1, 2024 regarding Chinese Patent Application No. 202080048453.5 corresponding to U.S. Appl. No. 17/597,300 (16 pages).
International Search Report of PCT/KR2020/007228, Sep. 16, 2020, 4 pages.
Extended European Search Report dated Jun. 23, 2023 for corresponding European Application No. EP 20834686.6 (9 pages).
Korean Office Action dated Jul. 9, 2024 regarding Korean Patent Application No. 10-2019-0079398 (6 pages).

* cited by examiner

LIGHT EMITTING ELEMENT, MANUFACTURING METHOD OF SAME, AND DISPLAY DEVICE

CROSS-REFERENCE TO RELATED APPLICATION

This application is a U.S. National Phase patent application of International Patent Application Number PCT/KR2020/007228, filed on Jun. 3, 2020, which claims priority to Korean Patent Application Number 10-2019-0079398, filed on Jul. 2, 2019, the entire contents of all of which are incorporated by reference herein.

BACKGROUND

1. Field

The present disclosure relates to a light emitting element, a manufacturing method of the same, and a display device.

2. Description of Related Art

The importance of display devices is increasing with the development of multimedia. Accordingly, various types of display devices such as organic light-emitting diode (OLED) display devices and liquid crystal display (LCD) devices are being used.

A display panel such as an OLED panel or an LCD panel is a device included in a display device to display an image. Among such display panels, a light-emitting element may be provided as a light-emitting display panel, and examples of a light-emitting diode (LED) include an organic LED (OLED) using an organic material as a fluorescent material and an inorganic LED using an inorganic material as a fluorescent material.

SUMMARY

Aspects and features of embodiments of the present disclosure provide light emitting elements that include the same active layer but emit different light and a method of manufacturing the light emitting elements.

Aspects and features of embodiments of the present disclosure also provide a display device that can display light of various colors by including the above light emitting elements.

It should be noted that aspects and features of embodiments of the present disclosure are not limited thereto and other aspects, which are not mentioned herein, will be apparent to those of ordinary skill in the art from the following description.

According to one or more embodiments of the present disclosure, a light emitting element includes a first semiconductor layer and a second semiconductor layer, an active layer between the first semiconductor layer and the second semiconductor layer, an insulating film around side surfaces of at least the active layer, and a wavelength conversion material on at least a portion of the insulating film, wherein light emitted to the outside and light emitted from the active layer have different central wavelength bands.

The active layer is configured to emit first light whose central wavelength band is a first wavelength, and the wavelength conversion material is configured to convert the first light into second light whose central wavelength band is a second wavelength.

An area in which the wavelength conversion material is located on the insulating film may overlap at least the active layer.

The central wavelength band of the first light may be in a range of 450 nm to 495 nm, and the wavelength conversion material may include a quantum dot material.

The central wavelength band of the second light may be in a range of 495 nm to 570 nm or 620 nm to 750 nm.

The first semiconductor layer, the active layer, and the second semiconductor layer may be sequentially located along a first direction, and at least a portion of light to be emitted from the wavelength conversion material is to travel in a direction different from the first direction.

The light emitting element may further include scatterers located on the insulating film and configured to scatter incident light.

The light emitting element may further include an electrode layer on the second semiconductor layer, wherein the insulating film is around at least a portion of an outer surface of the electrode layer.

The light emitting element may further include a ligand bound to the insulating film, wherein the wavelength conversion material may be bound to the ligand.

According to one or more embodiments of the present disclosure, a method of manufacturing a light emitting element includes forming a semiconductor rod on a lower substrate, the semiconductor rod includes a semiconductor crystal and an insulating film on an outer surface of the semiconductor crystal, and forming a wavelength conversion material on the insulating film and separating the semiconductor rod from the lower substrate.

The semiconductor crystal may include a first semiconductor layer, a second semiconductor layer, and an active layer between the first semiconductor layer and the second semiconductor layer, and light to be emitted from the active layer and light to be emitted out of the wavelength conversion material have different central wavelength bands.

In the separating of the semiconductor rod, the wavelength conversion material may be attached on the insulating film after the semiconductor rod is separated from the lower substrate.

The semiconductor rod may further include a ligand bound to the insulating film, and the wavelength conversion material is bound to the ligand.

According to one or more embodiments of the present disclosure, a display device includes a first pixel and a second pixel, each of the first pixel and the second pixel includes a substrate, a first electrode on the substrate, a second electrode on the substrate and spaced from the first electrode, and one or more light emitting elements between the first electrode and the second electrode, wherein each of the light emitting elements includes a first semiconductor layer and a second semiconductor layer, an active layer between the first semiconductor layer and the second semiconductor layer, an insulating film around side surfaces of at least the active layer; and a wavelength conversion material on at least a portion of the insulating film, wherein the one or more the light emitting elements may include a first light emitting element in which light to be emitted from the active layer and light to be emitted out of the light emitting element are the same and a second light emitting element in which light to be emitted from the active layer and light to be emitted out of the light emitting element have different central wavelength bands.

The active layer of each of the first light emitting element and the second light emitting element is to emit first light whose central wavelength band is a first wavelength, the first light emitting element may be in the first pixel, and the wavelength conversion material of the second light emitting element may include a first wavelength conversion material and the second light emitting element is in the second pixel.

The central wavelength band of the first light may be in a range of 450 nm to 495 nm, and the wavelength conversion material may include a quantum dot material.

The first wavelength conversion material is to convert the first light into second light whose central wavelength band is a second wavelength different from the first wavelength.

Each of the first light emitting element and the second light emitting element may further include scatterers located on the insulating film, the scatterers being configured to scatter incident light.

The display device may further include a third pixel, wherein the one or more light emitting elements may further include a third light emitting element in the third pixel, the wavelength conversion material of the third light emitting element includes a second wavelength conversion material.

An active layer of the third light emitting element is to emit the first light, and the second wavelength conversion material is to convert the first light into third light whose central wavelength band is a third wavelength different from the first wavelength and the second wavelength.
The details of other embodiments are included in the detailed description and the accompanying drawings.

Light emitting elements according to an embodiment may each include wavelength conversion materials that convert light emitted from an active layer and may emit light having a different central wavelength band from the light emitted from the active layer. The light emitting elements may include active layers emitting the same light but may emit different light to the outside according to the type of the wavelength conversion materials.

Accordingly, a display device according to an embodiment may display light of various colors by including the above light emitting elements which have the same active layer but emit different light.

The effects, aspects, and features of embodiments of the present disclosure are not limited by the contents exemplified above, and more various effects, aspects, and features are included in this disclosure.

DETAILED DESCRIPTION

The present disclosure will now be described more fully hereinafter with reference to the accompanying drawings, in which one or more embodiments of the present disclosure are shown. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Hereinafter, embodiments will be described with reference to the accompanying drawings.

Figure 1:
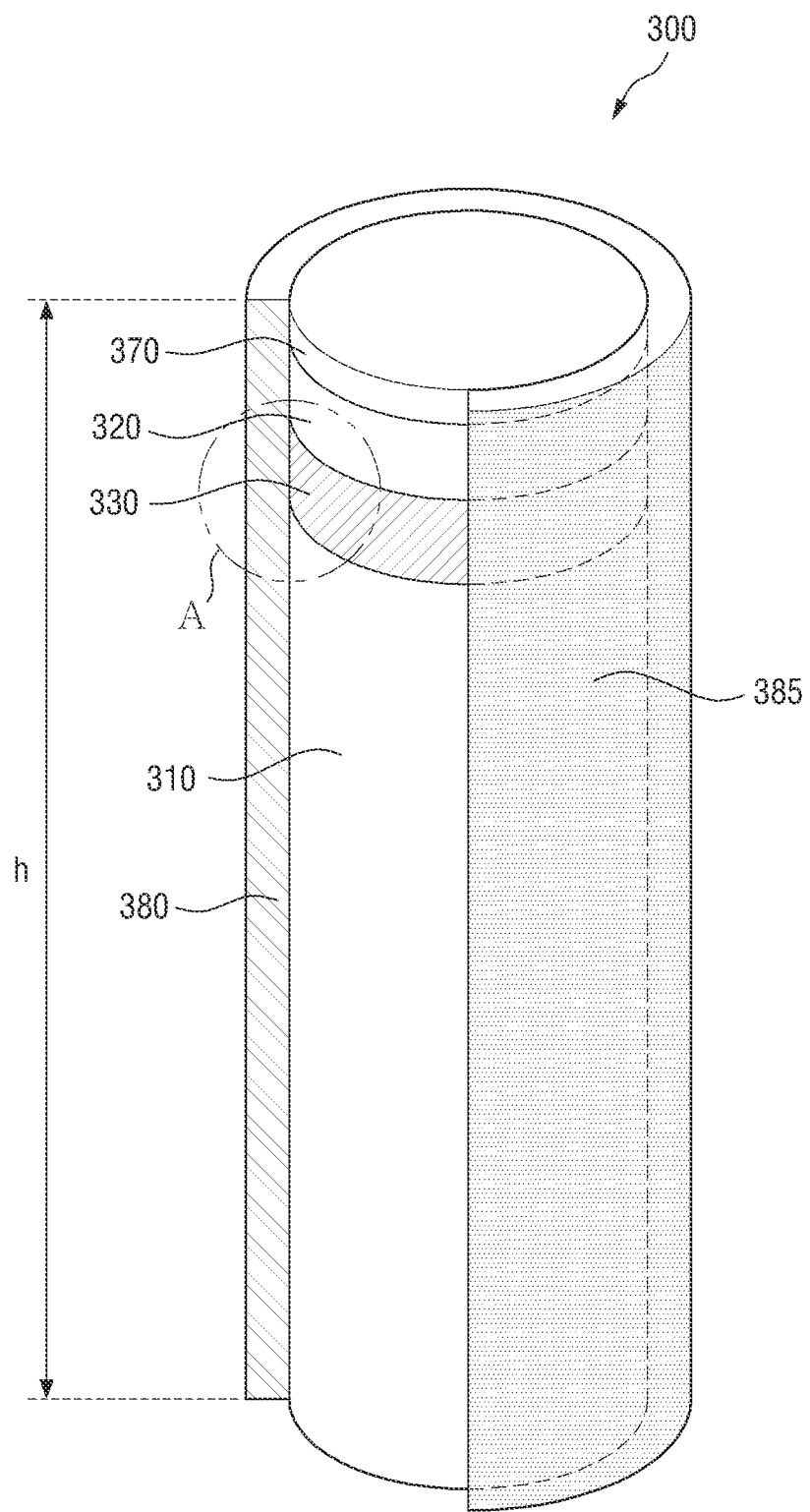
FIG. 1 is a schematic cutaway view of a light emitting element according to one or more embodiments.

FIG. 1 is a schematic cutaway view of a light emitting element according to one or more embodiments.

The light emitting element 300 may be a light emitting diode. For example, the light emitting element 300 may be an inorganic light emitting diode having a size of micrometers or nanometers and made of an inorganic material. When an electric field is formed in a specific direction between two electrodes facing each other, the inorganic light emitting diode may be aligned between the two electrodes in which polarities are formed. The light emitting element 300 may be aligned between two electrodes by an electric field formed between the electrodes.

The light emitting element 300 may extend in one direction. The light emitting element 300 may be shaped like a rod, a wire, a tube, or the like. In one or more embodiments, the light emitting element 300 may be shaped like a cylinder or a rod. However, the shape of the light emitting element 300 is not limited thereto, and the light emitting element 300 may also have various shapes including polygonal prisms, such as a cube, a rectangular parallelepiped and a hexagonal prism, and a shape extending in a direction and having a partially inclined outer surface. A plurality of semiconductors included in the light emitting element 300 which will be described later may be sequentially disposed or stacked along the one direction.

The light emitting element 300 may include a semiconductor layer doped with impurities of any conductivity type (e.g., a p type or an n type). The semiconductor layer may receive an electrical signal from an external power source and emit light in a specific wavelength band.

The light emitting element 300 according to one or more embodiments may emit light in a specific wavelength band. In one or more embodiments, an active layer 330 may emit blue light whose central wavelength band is in the range of 450 to 495 nm. However, the central wavelength band of the blue light is not limited to the above range and should be understood to include all wavelength ranges that can be recognized as blue in the art to which the disclosure pertains. In addition, light emitted from the active layer 330 of the light emitting element 300 is not limited thereto and may also be green light whose central wavelength band is in the range of 495 to 570 nm or red light whose central wavelength band is in the range of 620 to 750 nm.

Referring to FIG. 1, the light emitting element 300 according to one or more embodiments may include a first semiconductor layer 310, a second semiconductor layer 320, the active layer 330, an insulating film 380, and wavelength conversion materials 385 (e.g., one or more materials). In addition, the light emitting element 300 according to one or more embodiments may further include at least one electrode layer 370. Although the light emitting element 300 includes one electrode layer 370 in FIG. 1, the present disclosure is not limited thereto. In some cases, the light emitting element 300 may include more electrode layers 370, or the electrode layer 370 may be omitted. The following description of the light emitting element 300 may apply equally even if the number of electrode layers 370 is changed or another structure is further included.

The first semiconductor layer 310 may be, for example, an n-type semiconductor having a first conductivity type. In an example, when the light emitting element 300 emits light in a blue wavelength band, the first semiconductor layer 310 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of n-type doped AlGaInN, GaN, AlGaN, InGaN, AlN, and InN. The first semiconductor layer 310 may be doped with a first conductivity type dopant, and the first conductivity type dopant may be, for example, Si, Ge, or Sn. In one or more embodiments, the first semiconductor layer 310 may be n-GaN doped with n-type Si. A length of the first semiconductor layer 310 may be in the range of, but not limited to, 1.5 to 5 μm.

The second semiconductor layer 320 is disposed on the active layer 330 to be described later. The second semiconductor layer 320 may be, for example, a p-type semiconductor having a second conductivity type. In an example, when the light emitting element 300 emits light in a blue or green wavelength band, the second semiconductor layer 320 may include a semiconductor material having a chemical formula of $Al_xGa_yIn_{1-x-y}N$ ($0 \leq x \leq 1$, $0 \leq y \leq 1$, $0 \leq x+y \leq 1$), for example, may be any one or more of p-type doped AlGaInN, GaN, AlGaN, InGaN, AlN, and InN. The second semiconductor layer 320 may be doped with a second conductivity type dopant, and the second conductivity type dopant may be, for example, Mg, Zn, Ca, Se, or Ba. In one or more embodiments, the second semiconductor layer 320 may be p-GaN doped with p-type Mg. A length of the second semiconductor layer 320 may be in the range of, but not limited to, 0.05 to 0.10 mm.

Although each of the first semiconductor layer 310 and the second semiconductor layer 320 is composed of one layer in the drawing, the present disclosure is not limited thereto. In some cases, each of the first semiconductor layer 310 and the second semiconductor layer 320 may include more layers, for example, may further include a clad layer or a tensile strain barrier reducing (TSBR) layer depending on the material of the active layer 330.

The active layer 330 is disposed between the first semiconductor layer 310 and the second semiconductor layer 320. The active layer 330 may include a material having a single or multiple quantum well structure. When the active layer 330 includes a material having a multiple quantum well structure, it may have a structure in which a plurality of quantum layers and a plurality of well layers are alternately stacked. The active layer 330 may emit light through combination of electron-hole pairs according to an electrical signal received through the first semiconductor layer 310 and the second semiconductor layer 320. For example, when the active layer 330 emits light in the blue wavelength band, it may include a material such as AlGaN or AlGaInN. For example, when the active layer 330 has a multiple quantum well structure in which a quantum layer and a well layer are alternately stacked, the quantum layer may include a material such as AlGaN or AlGaInN, and the well layer may include a material such as GaN or AlInN. In one or more embodiments, the active layer 330 may include AlGaInN as a quantum layer and AlInN as a well layer to emit blue light whose central wavelength band is in the range of 450 to 495 nm as described above.

However, the present disclosure is not limited thereto, and the active layer 330 may also have a structure in which a semiconductor material having a large band gap energy and a semiconductor material having a small band gap energy are alternately stacked or may include different Group III to V semiconductor materials depending on the wavelength band of light that it emits. Light emitted from the active layer 330 is not limited to light in the blue wavelength band. In some cases, the active layer 330 may emit light in a red or green wavelength band. A length of the active layer 330 may be in the range of, but not limited to, 0.05 to 0.10 μm.

Light emitted from the active layer 330 may be radiated not only to an outer surface of the light emitting element 300 in a longitudinal direction, but also to both side surfaces. The direction of light emitted from the active layer 330 is not limited to one direction.

The electrode layer 370 may be disposed at an end of the light emitting element 300 in the longitudinal direction. For example, the electrode layer 370 may be located at a top end of the light emitting element 300 on the second semiconductor layer 320. The electrode layer 370 may be an ohmic contact electrode. However, the present disclosure is not limited thereto, and the electrode layer 370 may also be a Schottky contact electrode. The electrode layer 370 may include a conductive metal. For example, the electrode layer 370 may include at least any one of aluminum (Al), titanium (Ti), indium (In), gold (Au), silver (Ag), indium tin oxide (ITO), indium zinc oxide (IZO), and indium tin zinc oxide (ITZO). In addition, the electrode layer 370 may include an n-type or p-type doped semiconductor material. The electrode layer 370 may include the same material or different materials, but the present disclosure is not limited thereto.

The insulating film 380 surrounds outer surfaces (e.g., outer peripheral or circumferential surfaces) of the semiconductors described above. In one or more embodiments, the insulating film 380 may surround an outer surface (e.g., an outer peripheral or circumferential surface) of at least the active layer 330 and extend in the direction in which the light emitting element 300 extends. The insulating film 380 may protect the above members. For example, the insulating film 380 may be around (or surround) side surfaces of the above members but may expose both ends of the light emitting element 300 in the longitudinal direction.

In the drawing, the insulating film 380 extends in the longitudinal direction of the light emitting element 300 to cover from the first semiconductor layer 310 to the electrode layer 370. However, the present disclosure is not limited thereto, and the insulating film 380 may also cover outer surfaces (e.g., outer peripheral or circumferential surfaces) of only some conductivity type semiconductors as well as the active layer 330 or may cover only a portion of an outer surface (e.g., an outer peripheral or circumferential surface) of the electrode layer 370 to partially expose the outer surface of the electrode layer 370. In addition, an upper surface of the insulating film 380 may be rounded in cross section in an area adjacent to at least one end of the light emitting element 300.

A thickness of the insulating film 380 may be in the range of, but not limited to, 10 nm to 1.0 μm. The thickness of the insulating film 380 may preferably be about 40 nm.

The insulating film 380 may include a material having insulating properties such as silicon oxide (SiOx), silicon nitride (SiNx), silicon oxynitride (SiOxNy), aluminum nitride (AlN), or aluminum oxide ($Al_2O_3$). Therefore, the insulating film 380 can prevent an electrical short circuit that may occur when the active layer 330 directly contacts an electrode through which an electrical signal is transmitted to the light emitting element 300. In addition, the insulating film 380 can prevent a reduction in luminous efficiency by protecting the outer surface (e.g., the outer peripheral or circumferential surface) of the light emitting element 300 including the active layer 330.

In addition, in one or more embodiments, an outer surface (e.g., an outer peripheral or circumferential surface) of the insulating film 380 may be treated. When a display device 10 is manufactured, the light emitting element 300 may be sprayed on electrodes in a state where it is dispersed in ink (e.g., a predetermined ink) and then may be aligned. Here, the surface of the insulating film 380 may be hydrophobic or hydrophilic-treated so that the light emitting element 300 remains separate from other adjacent light emitting elements 300 in the ink without agglomerating with them.

The light emitting element 300 according to one or more embodiments may include a plurality of wavelength conversion materials 385 disposed on the insulating film 380. The wavelength conversion materials 385 may convert or shift incident light having a specific central wavelength band into light having a different central wavelength band. When light emitted from the active layer 330 of the light emitting element 300 is incident, the wavelength conversion materials 385 disposed on the insulating film 380 may convert or shift the light into light in another wavelength band and emit the light.

Figure 2:
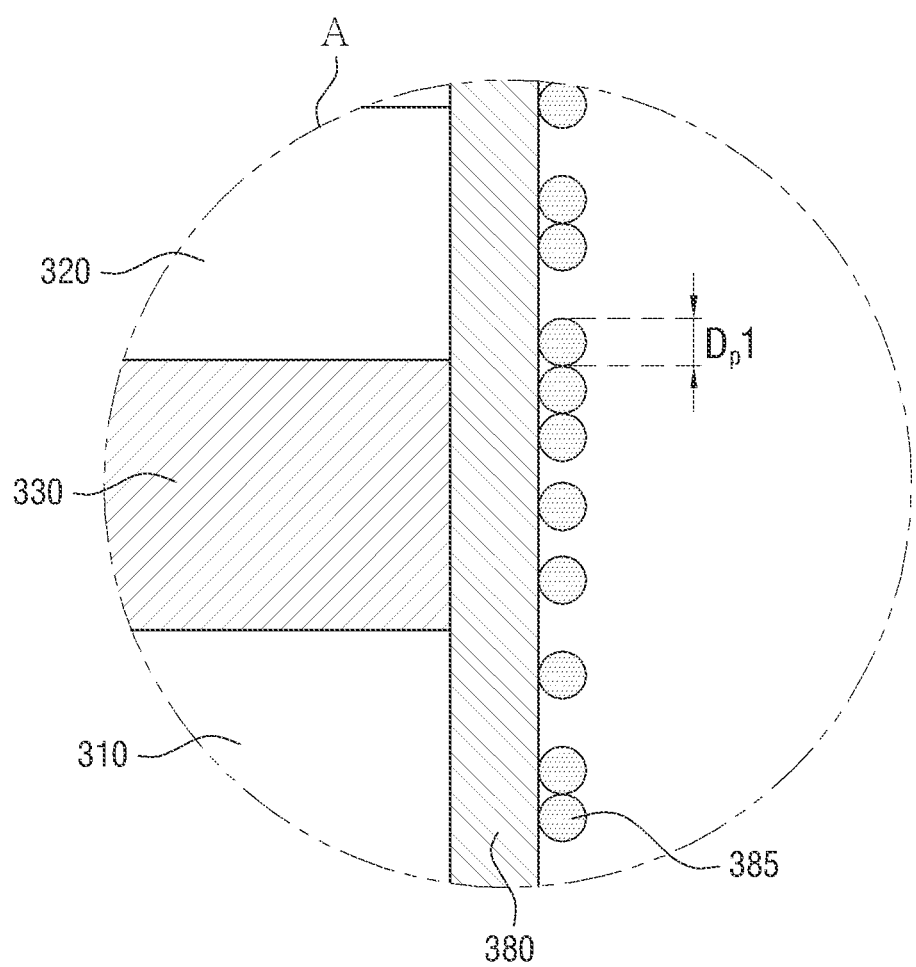
FIG. 2 is an enlarged view of portion A of FIG. 1.
Figure 3:
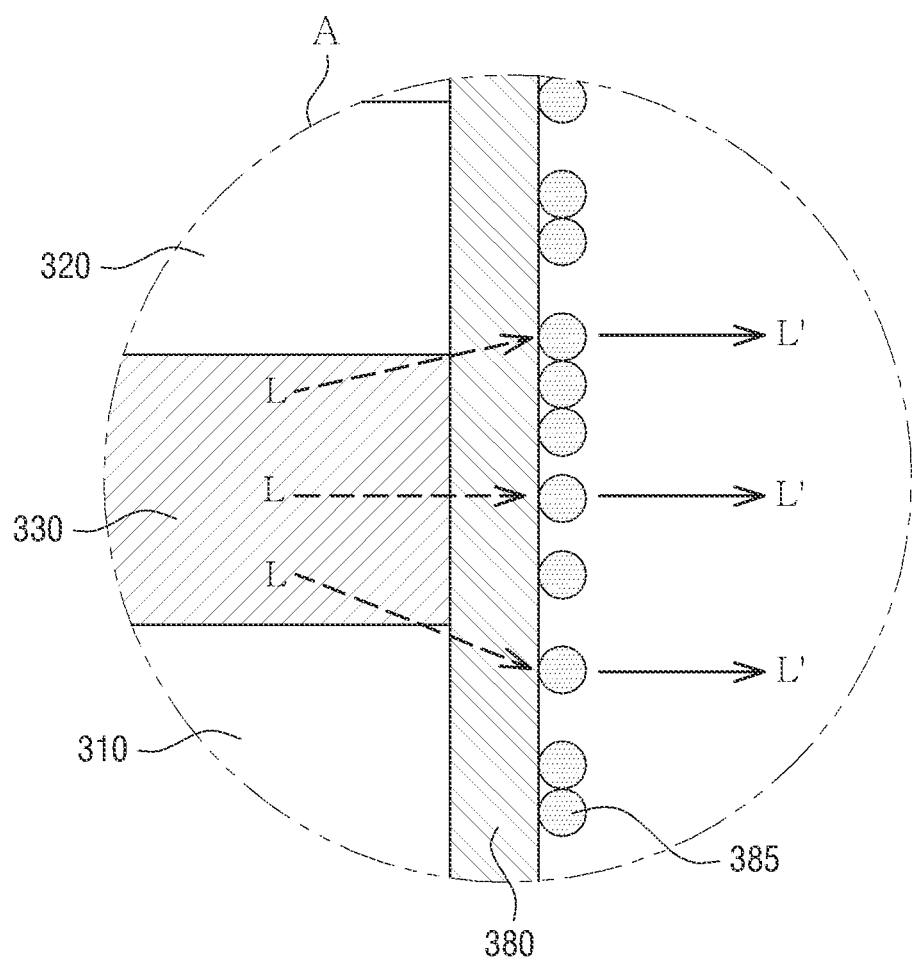
FIG. 3 is a schematic diagram illustrating light emitted from the light emitting element according to one or more embodiments.

FIG. 2 is an enlarged view of portion A of FIG. 1. FIG. 3 is a schematic diagram illustrating light emitted from the light emitting element according to one or more embodiments.

Referring further to FIGS. 2 and 3 in conjunction with FIG. 1, the light emitting element 300 may include a plurality of wavelength conversion materials 385, and the wavelength conversion materials 385 may cover the outer surface (e.g., the outer peripheral or circumferential surface) of the insulating film 380. As illustrated in the drawings, the wavelength conversion materials 385 may be disposed on the insulating film 380 to partially or entirely cover the insulating film 380 and may be randomly disposed to contact each other or to be spaced from each other. The wavelength conversion materials 385 may form one layer that covers at least a portion of the insulating film 380. However, the present disclosure is not limited thereto. The wavelength conversion materials 385 may also be disposed on only a portion of the insulating film 380. The wavelength conversion materials 385 may be disposed only on the insulating film 380 around (or surrounding) the outer surface (e.g., the outer peripheral or circumferential surface) of at least the active layer 330 to receive light emitted from the active layer 330 of the light emitting element 300 as described above. An area in which the wavelength conversion materials 385 are disposed on the insulating film 380 may overlap at least the active layer 330.

The insulating film 380 of the light emitting element 300 may be around (or may surround) side surfaces from among the outer surfaces (e.g., outer peripheral or circumferential surfaces) of the first semiconductor layer 310, the active layer 330, the second semiconductor layer 320, and the electrode layer 370. Therefore, in one or more embodiments, the wavelength conversion materials 385 disposed on the insulating film 380 may emit light at least in a lateral direction of the light emitting element 300. Because the light emitting element 300 extending in one direction includes the wavelength conversion materials 385 disposed on the insulating film 380, it may emit light in a specific wavelength band in a direction different from the extending direction. However, the present disclosure is not limited thereto, and the direction of light emitted from the wavelength conversion materials 385 of the light emitting element 300 may be various.

The light emitting element 300 may be manufactured by performing a process of forming the insulating film 380 and then disposing the wavelength conversion materials 385 on the insulating film 380 during a manufacturing process. The wavelength conversion materials 385 may be disposed on the insulating film 380 by forming a physical bond or a chemical bond between the insulating film 380 and the wavelength conversion materials 385. In one or more embodiments, the wavelength conversion materials 385 may be directly synthesized on the insulating film 380. This will be described later.

The wavelength conversion materials 385 may be spherical or elliptical but are not limited to a particular shape. In one or more embodiments, the wavelength conversion materials 385 may be quantum dots (e.g., one or more quantum dot materials), quantum rods, or phosphors. For example, the wavelength conversion materials 385 may be quantum dots that emit light in a specific wavelength band when electrons transit from a conduction band to a valence band.

The quantum dots may be semiconductor nanocrystalline materials. The quantum dots may have a specific band gap according to their composition and size. Thus, the quantum dots may absorb light and then emit light having a unique wavelength. Examples of semiconductor nanocrystals of the quantum dots include Group IV nanocrystals, Group II-VI compound nanocrystals, Group III-V compound nanocrystals, Group IV-VI nanocrystals, and combinations of the same.

The Group II-VI compounds may be selected from binary compounds selected from CdSe, CdTe, ZnS, ZnSe, ZnTe, ZnO, HgS, HgSe, HgTe, MgSe, MgS and mixtures of the same; ternary compounds selected from InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures of the same; and quaternary compounds selected from HgZnTeS, CdZnSeS, CdZnSeTe, CdZnSTe, CdHgSeS, CdHgSeTe, CdHgSTe, HgZnSeS, HgZnSeTe, HgZnSTe and mixtures of the same.

The Group III-V compounds may be selected from binary compounds selected from GaN, GaP, GaAs, GaSb, AlN, AlP, AlAs, AlSb, InN, InP, InAs, InSb and mixtures of the same; ternary compounds selected from GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP and mixtures of the same; and quaternary compounds selected from GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures of the same.

The Group IV-VI compounds may be selected from binary compounds selected from SnS, SnSe, SnTe, PbS, PbSe, PbTe and mixtures of the same; ternary compounds selected from SnSeS, SnSeTe, SnSTe, PbSeS, PbSeTe, PbSTe, SnPbS, SnPbSe, SnPbTe and mixtures of the same; and quaternary compounds selected from SnPbSSe, SnPbSeTe, SnPbSTe and mixtures of the same. The Group IV elements may be selected from silicon (Si), germanium (Ge), and a mixture of the same. The Group IV compounds may be binary compounds selected from silicon carbide (SiC), silicon germanium (SiGe), and a mixture of the same.

Here, the binary, ternary or quaternary compounds may be in particles at a uniform concentration or may be in the same particles at partially different concentrations. In addition, they may have a core/shell structure in which one quantum dot is around (or surrounds) another quantum dot. An interface between the core and the shell may have a concentration gradient in which the concentration of an element in the shell is reduced toward the center.

In one or more embodiments, the quantum dots may have a core-shell structure including a core containing the above-described nanocrystal and a shell around (or surrounding) the core. The shell of each quantum dot may serve as a protective layer for maintaining semiconductor characteristics by preventing chemical denaturation of the core and/or as a charging layer for giving electrophoretic characteristics to the quantum dot. The shell may be a single layer or a multilayer. An interface between the core and the shell may have a concentration gradient in which the concentration of an element in the shell is reduced toward the center. The shell of each quantum dot may be, for example, a metal or non-metal oxide, a semiconductor compound, or a combination of the same.

For example, the metal or non-metal oxide may be, but is not limited to, a binary compound such as $SiO_2$, $Al_2O_3$, $TiO_2$, ZnO, MnO, $Mn_2O_3$, $MnaO_4$, CuO, FeO, $Fe_2O_3$, $Fe_3O_4$, CoO, $CoaO_4$ or NiO or a ternary compound such as $MgAl_2O_4$, $CoFe_2O_4$, $NiFe_2O_4$ or $CoMn_2O_4$.

In addition, the semiconductor compound may be, but is not limited to, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb.

When the wavelength conversion materials 385 include quantum dots, a diameter Dp1 of the wavelength conversion materials 385 may be in the range of several nanometers (nm) to several tens of nanometers (nm). For example, the diameter Dp1 of the wavelength conversion materials 385 may be in the range of, but not limited to, 1 to 10% of a diameter of the light emitting element 300.

As illustrated in FIG. 3, light L having a specific central wavelength band may be emitted from the active layer 330 of the light emitting element 300. The light L emitted from the active layer 330 may travel in random directions without directionality, and at least a portion of the light L may enter the insulating film 380. The light incident on the insulating film 380 may enter the wavelength conversion materials 385 through the insulating film 380, and the wavelength conversion materials 385 may convert the light L emitted from the active layer 330 into light L' having a different central wavelength band and emit the light L'. In the light emitting element 300 according to one or more embodiments, the light L emitted from the active layer 330 and the light L' emitted from the outer surface of the light emitting element 300 (e.g., the light L' emitted from the wavelength conversion materials 385) may have different central wavelength bands.

The active layer 330 of the light emitting element 300 may emit light through combination of electron-hole pairs according to an electrical signal received from the first semiconductor layer 310 and the second semiconductor layer 320. For example, the active layer 330 may include a material such as AlGaN or AlGaInN to emit blue light whose central wavelength band is in the range of 450 to 495 nm. In addition, the light emitting element 300 may emit green light or red light according to the material that forms the active layer 330.

As will be described later, light emitting elements 300 may be manufactured through an epitaxial growth process. In order to manufacture light emitting elements 300 emitting different light, a process of growing active layers 330 including different component ratios or materials may be performed. That is, an epitaxial growth process under different conditions is required to manufacture a light emitting element 300 including an active layer 330 emitting light of a color different from blue light, and production cost and yield may be low.

On the other hand, the light emitting element 300 according to one or more embodiments includes the active layer 330 emitting light of the same color, but the light L emitted from the active layer 330 may be converted into the light L' having a different central wavelength band by changing the wavelength conversion materials 385 disposed on the insulating film 380. Even if the active layer 330 emits light of the same central wavelength band, the light emitting element 300 may emit light of a different wavelength band according to the type of the wavelength conversion materials 385. Accordingly, even if only an epitaxial growth process under specific conditions is performed, the light emitting element 300 emitting light of various colors can be manufactured by adjusting the wavelength conversion materials 385.

In one or more embodiments, the light emitting element 300 may include the active layer 330 that emits light having a central wavelength band of 450 to 495 nm and may include the wavelength conversion materials 385 which, when blue light is incident, convert the blue light into green light having a central wavelength band of 495 to 570 nm or red light having a central wavelength band of 620 to 750 nm. However, the present disclosure is not limited thereto, and the wavelength conversion materials 385 may also convert the blue light into light having a different central wavelength band other than the green light or the red light.

As will be described later, a display device 10 (e.g., see, FIG. 19) according to one or more embodiments may include different light emitting elements 300 that include active layers 330 emitting blue light but emit the blue light as it is or emit light having a different central wavelength band. In one or more embodiments, the wavelength conversion materials may be omitted, and the display device 10 may include first light emitting elements 301 (see FIG. 21) that emit first light L1 emitted from the active layers 330 to the outside, second light emitting elements 302 (see FIG. 21) that include first wavelength conversion materials to emit second light L2 to the outside, and third light emitting elements 303 (see FIG. 21) that include second wavelength conversion materials to emit third light L3 to the outside. The display device 10 may include the light emitting elements 300 that include the same type of active layers 330 but emit different light. Accordingly, the display device 10 may display various colors.

In addition, light emitted from the wavelength conversion materials 385 may have a full width of half maximum (FWHM) of an emission wavelength spectrum of about 45 nm or less, about 40 nm or less, or about 30 nm or less, and the color purity and color reproducibility of colors displayed by the display device 10 including the light emitting elements 300 can be further improved.

Figure 4:
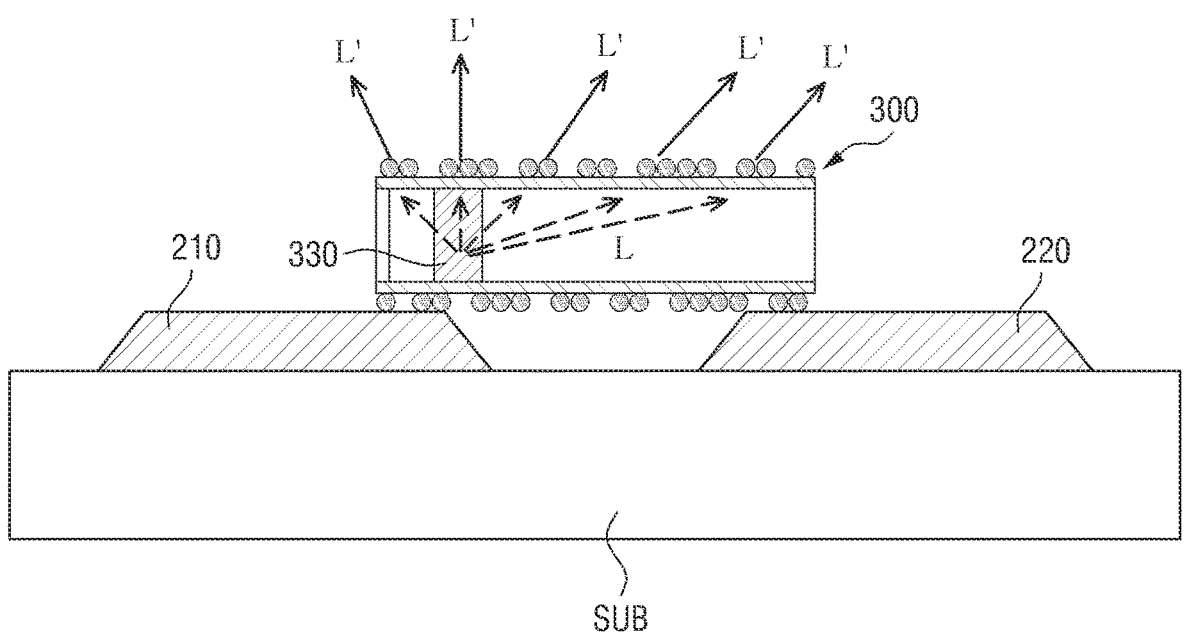
FIG. 4 is a schematic cross-sectional view illustrating the light emitting element disposed on electrodes according to one or more embodiments.

FIG. 4 is a schematic cross-sectional view illustrating the light emitting element disposed on electrodes according to one or more embodiments.

Referring to FIG. 4, in one or more embodiments, the light emitting element 300 included in the display device 10 may be disposed on a first electrode 210 and a second electrode 220 disposed on a target substrate SUB. The first electrode 210 and the second electrode 220 disposed on the target substrate SUB may be spaced to face each other. The light emitting element 300 may extend in one direction, and the direction in which the light emitting element 300 extends may be the same as a direction in which the first electrode 210 and the second electrode 220 are spaced from each other.

As illustrated in the drawing, the light emitting element 300 may be disposed between the first electrode 210 and the second electrode 220 such that the extending direction of the light emitting element 300 is parallel to an upper surface of the target substrate SUB. In one or more embodiments, both ends of the light emitting element 300 may be disposed on the first electrode 210 and the second electrode 220. For example, a first end of the light emitting element 300 may be disposed on the first electrode 210 and a second end of the light emitting element 300 may be disposed on the second electrode 220. Although not illustrated in FIG. 4, the light emitting element 300 may be electrically connected to the first electrode 210 and the second electrode 220 and may receive an electrical signal (e.g., a predetermined electrical signal) from them so that the active layer 330 emits light L in a specific wavelength band.

As described above, the light L emitted from the active layer 330 of the light emitting element 300 may travel in random directions without directionality. At least a portion of the light L emitted from the active layer 330 may enter the wavelength conversion materials 385, and the wavelength conversion materials 385 may convert the light L incident from the active layer 330 into light L' having a different wavelength and emit the light L'. The light L' emitted from the wavelength conversion materials 385 may be emitted in various directions regardless of the incident direction of the light L emitted and incident from the active layer 330. That is, the light L' emitted from the wavelength conversion materials 385 may travel in various directions including a direction perpendicular to the extending direction of the light emitting element 300, that is, an upward direction above the target substrate SUB. For example, the first semiconductor layer 310, the active layer 330, and the second semiconductor layer 320 of the light emitting element 300 are sequentially disposed in one direction in which the light emitting element 300 extends. In the light emitting element 300 according to one or more embodiments, at least a portion of the light L' emitted to the outside may travel in a direction different from the one direction. Even when the light emitting element 300 is disposed on the target substrate SUB in a horizontal direction, it may emit light of a specific wavelength band in the upward direction above the target substrate SUB.

In addition, because the light L emitted from the active layer 330 of the light emitting element 300 and the light L' emitted out of the light emitting element 300 have different central wavelength bands, various colors can be displayed using light emitting elements 300 that have the same active layer 330 but include different wavelength conversion materials 385. The display device 10 including the light emitting elements 300 will be described in more detail later with reference to other drawings.

Referring again to FIG. 1, a length h of the light emitting element 300 may be in the range of 1 to 10 μm or 2 to 6 μm and in one or more embodiments may be (e.g., may preferably be) in the range of 3 to 5 μm. In addition, a diameter of the light emitting element 300 may be in the range of 300 to 700 nm, and an aspect ratio of the light emitting element 300 may be 1.2 to 100. However, the present disclosure is not limited thereto, and a plurality of light emitting elements 300 included in the display device 10 may also have different diameters according to a difference in composition of the active layer 330. The diameter of the light emitting element 300 may be about 500 nm.

A method of manufacturing light emitting elements 300 according to one or more embodiments will now be described.

FIGS. 5 through 11 are schematic views illustrating a method of manufacturing light emitting elements according to one or more embodiments.

The method of manufacturing the light emitting elements 300 according to one or more embodiments may include forming semiconductor rods ROD (see FIG. 9), each including a plurality of semiconductor layers 310 and 320, an active layer 330 and an insulating film 380, on a lower substrate 2000 (see FIG. 5) and forming wavelength conversion materials 385 on the insulating films 380 and separating the semiconductor rods ROD from the lower substrate 2000. The light emitting elements 300 may include the semiconductor rods ROD grown on the lower substrate through an epitaxial growth method. Each of the semiconductor rods ROD may include a first semiconductor layer 310, a second semiconductor layer 320, an active layer 330, an electrode layer 370, and an insulating film 380. Next, the wavelength conversion materials 385 are formed on the insulating films 380 of the semiconductor rods ROD, and the semiconductor rods ROD are separated from the lower substrate to manufacture the light emitting elements 300.

Figure 5:
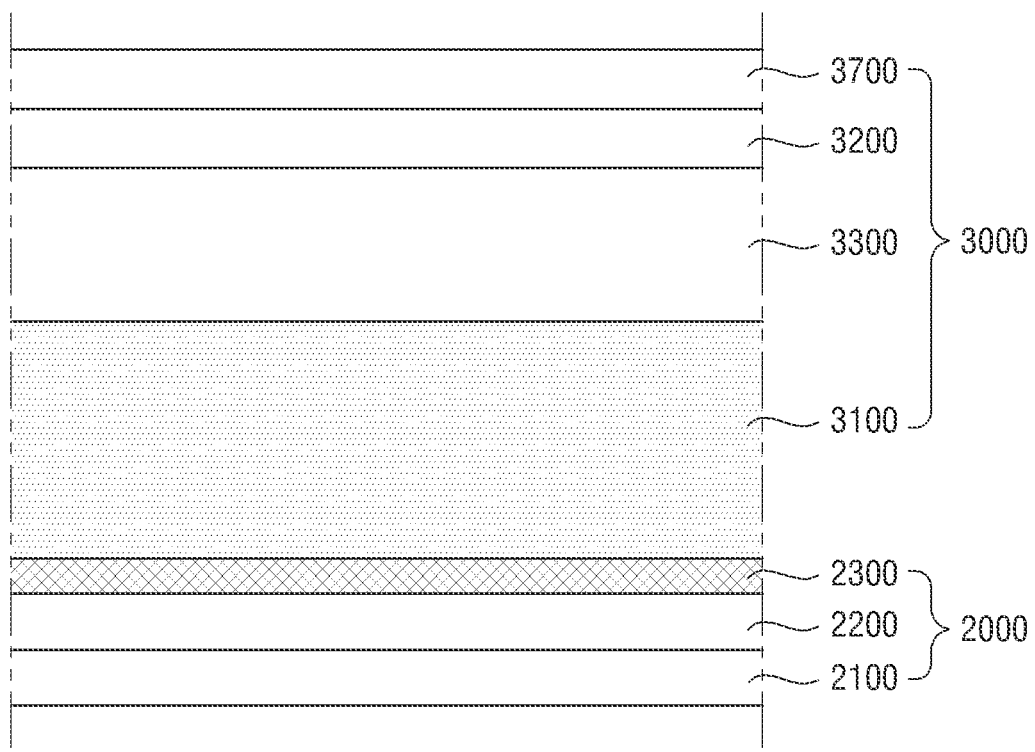
FIGS. 5 through 11 are schematic views illustrating a method of manufacturing light emitting elements according to one or more embodiments.

For example, referring first to FIG. 5, the lower substrate 2000 which includes a base substrate 2100, a buffer material layer 2200 formed on the base substrate 2100 and a separation layer 2300 formed on the buffer material layer 2200 and a semiconductor structure 3000 that is formed on the lower substrate 2000 are prepared. The lower substrate 2000 may have a structure in which the base substrate 2100, the buffer material layer 2200, and the separation layer 2300 are sequentially stacked.

The base substrate 2100 may include a sapphire substrate ($Al_2O_3$) or a transparent substrate such as glass. However, the present disclosure is not limited thereto, and the base substrate 2100 may also be made of a conductive substrate such as GaN, SiC, ZnO, Si, GaP, or GaAs. A case where the base substrate 2100 is a sapphire substrate ($Al_2O_3$) will be described below as an example. A thickness of the base substrate 2100 is not particularly limited but may be, for example, in the range of 400 to 1500 µm.

A plurality of semiconductor layers are formed on the base substrate 2100. The semiconductor layers grown by an epitaxial method may be formed by growing seed crystals. Here, the method of forming the semiconductor layers may be electron beam deposition, physical vapor deposition (PVD), chemical vapor deposition (CVD), plasma laser deposition (PLD), dual-type thermal evaporation, sputtering, or metal organic chemical vapor deposition (MOCVD) and may be (e.g., may preferably be) MOCVD, but the present disclosure is not limited thereto.

A precursor material for forming the semiconductor layers is not particularly limited within a range of materials that can be generally selected to form a target material. For example, the precursor material may include a metal precursor including an alkyl group such as a methyl group or an ethyl group. For example, the metal precursor may be, but is not limited to, a compound such as trimethyl gallium ($Ga(CH_3)_3$), trimethyl aluminum ($Al(CH_3)_3$), or triethyl phosphate ($(C_2H_5)_3PO_4$). A method and process conditions for forming the semiconductor layers will not be described below, and the order of the method of manufacturing the light emitting elements 300 and the stacked structure of each light emitting element 300 will be described in detail.

The buffer material layer 2200 is formed on the base substrate 2100. Although the buffer material layer 2200 is illustrated as a single layer, the present disclosure is not limited thereto, and a plurality of layers may also be formed. The buffer material layer 2200 may be disposed to reduce a difference in lattice constant between a first semiconductor 3100 and the base substrate 2100.

For example, the buffer material layer 2200 may include an undoped semiconductor and may include substantially the same material as the first semiconductor 3100 but may be a material not doped with an n type or a p type dopant. In one or more embodiments, the buffer material layer 2200 may be, but is not limited to, at least any one of undoped InAlGaN, GaN, AlGaN, InGaN, AlN, and InN. In addition, the buffer material layer 2200 may be omitted depending on the base substrate 2100. A case where the buffer material layer 2200 including an undoped semiconductor is formed on the base substrate 2100 will be described as an example.

The separation layer 2300 may be disposed on the buffer material layer 2200. The separation layer 2300 may include a material on which crystals of the first semiconductor 3100 can smoothly grow. The separation layer 2300 may include at least any one of an insulating material and a conductive material. For example, the separation layer 2300 may include silicon oxide (SiOx), silicon nitride (SiNx) or silicon oxynitride (SiOxNy) as an insulating material and include ITO, IZO, IGO, ZnO, graphene or graphene oxide as a conductive material. However, the present disclosure is not limited thereto.

The separation layer 2300 may be removed in an operation to be described later, and thus the light emitting elements 300 formed on the separation layer 2300 may be separated from the lower substrate 2000. The removing of the separation layer 2300 may be performed by a chemical separation method (CLO). Accordingly, an end surface of each light emitting element 300 may have a flat surface, like a surface of the separation layer 2300. In addition, the separation layer 2300 may serve as an etching stopper between the semiconductor structure 3000 and the buffer material layer 2200 in a process of etching the semiconductor structure 3000.

The semiconductor structure 3000 is disposed on the separation layer 2300. The semiconductor structure 3000 may include the first semiconductor 3100, an active layer 3300, a second semiconductor 3200, and an electrode material layer 3700. A plurality of material layers included in the semiconductor structure 3000 may be formed by performing a conventional process as described above, and the layers stacked in the semiconductor structure 3000 may correspond to the layers of each light emitting element 300, respectively. That is, they may include the same materials as the first semiconductor layer 310, the active layer 330, the second semiconductor layer 320, and the electrode layer 370 of each light emitting element 300, respectively. Each layer of the semiconductor structure 3000 will not be described in detail.

Next, semiconductor crystals 3000' are formed by etching the semiconductor structure 3000 in a direction perpendicular to the lower substrate 2000.

The forming of the semiconductor crystals 3000' by vertically etching the semiconductor structure 3000 may include an etching process that may be usually performed. In one or more embodiments, the forming of the semiconductor crystals 3000' may include forming an etch mask layer 1600 and an etch pattern layer 1700 on the semiconductor structure 3000, etching the semiconductor structure 3000 according to patterns of the etching pattern layer 1700, and removing the etch mask layer 1600 and the etch pattern layer 1700.

Figure 6:
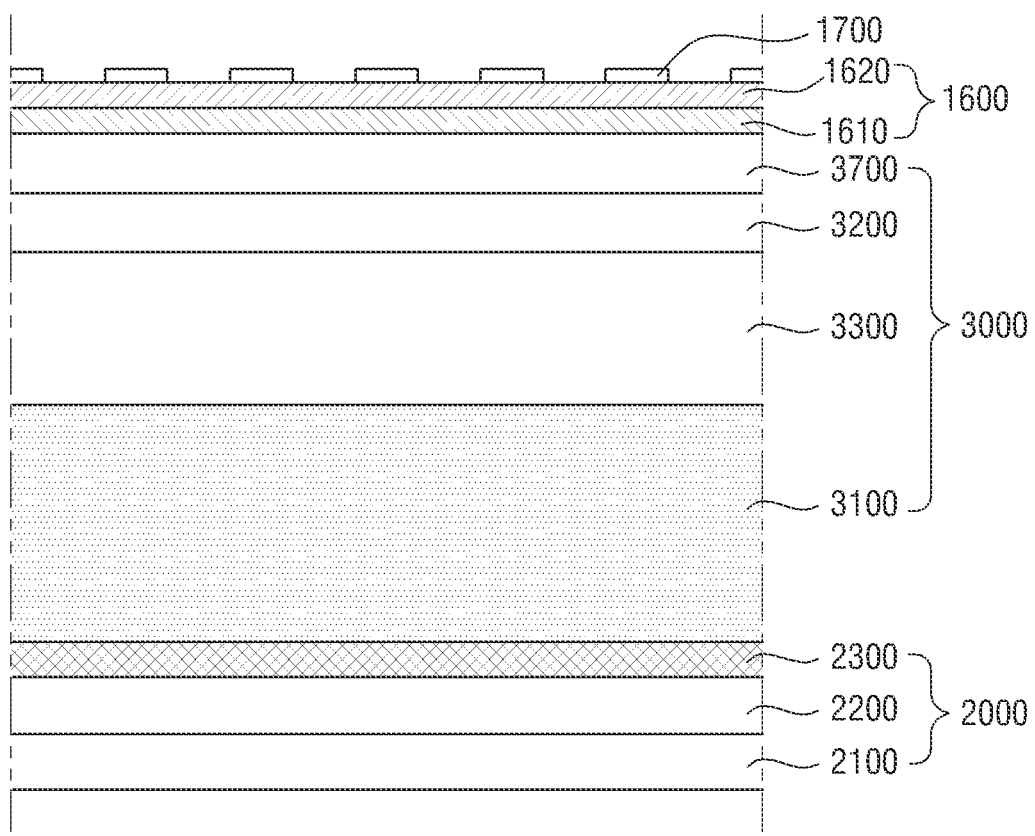

Referring to FIG. 6, the etch mask layer 1600 may serve as a mask for successively etching the layers of the semiconductor structure 3000. The etch mask layer 1600 may include a first etch mask layer 1610 including an insulating material and a second etch mask layer 1620 including a metal.

The first etch mask layer 1610 may include oxide or nitride as an insulating material. The insulating material may be, for example, silicon oxide (SiOx), silicon nitride (SiNx), or silicon oxynitride (SiOxNy). A thickness of the first etch mask layer 1610 may be in the range of, but not limited to, 0.5 to 1.5 µm.

The second etch mask layer 1620 is disposed on the first etch mask layer 1610. For example, the second etch mask layer 1620 may be a hard mask layer. The second etch mask layer 1620 may include a material that can serve as a mask for continuous etching of the semiconductor structure 3000 and may include, for example, a metal such as chromium (Cr). A thickness of the second etch mask layer 1620 may be in the range of, but not limited to, 30 to 150 nm.

The etch pattern layer 1700 may be disposed on the etch mask layer 1600. The etch pattern layer 1700 may include one or more nano-patterns spaced from each other. The etch pattern layer 1700 may include a polymer, polystyrene spheres, silica spheres or the like but is not limited to a particular material as long as it is a material that can form patterns.

For example, when the etch pattern layer 1700 includes a polymer, a conventional method for forming patterns using the polymer may be employed. For example, the etch pattern layer 1700 including the polymer may be formed using a method such as photolithography, e-beam lithography, or nano-imprint lithography.

In one or more embodiments, the etch pattern layer 1700 may be formed by nano-imprint lithography, and nano-patterns of the etch pattern layer 1700 may include a nano-imprint resin. The resin may include, but is not limited to, a fluorinated monomer, an acrylate monomer, dipentaerythritol hexaacrylate, dipropylene glycol diacrylate, poly(ethylene glycol) phenyletheracrylate, butylated hydroxy toluene (BHT), or 1-hydroxy-cyclohexylphenylketone (Irgacure 184).

Figure 7:
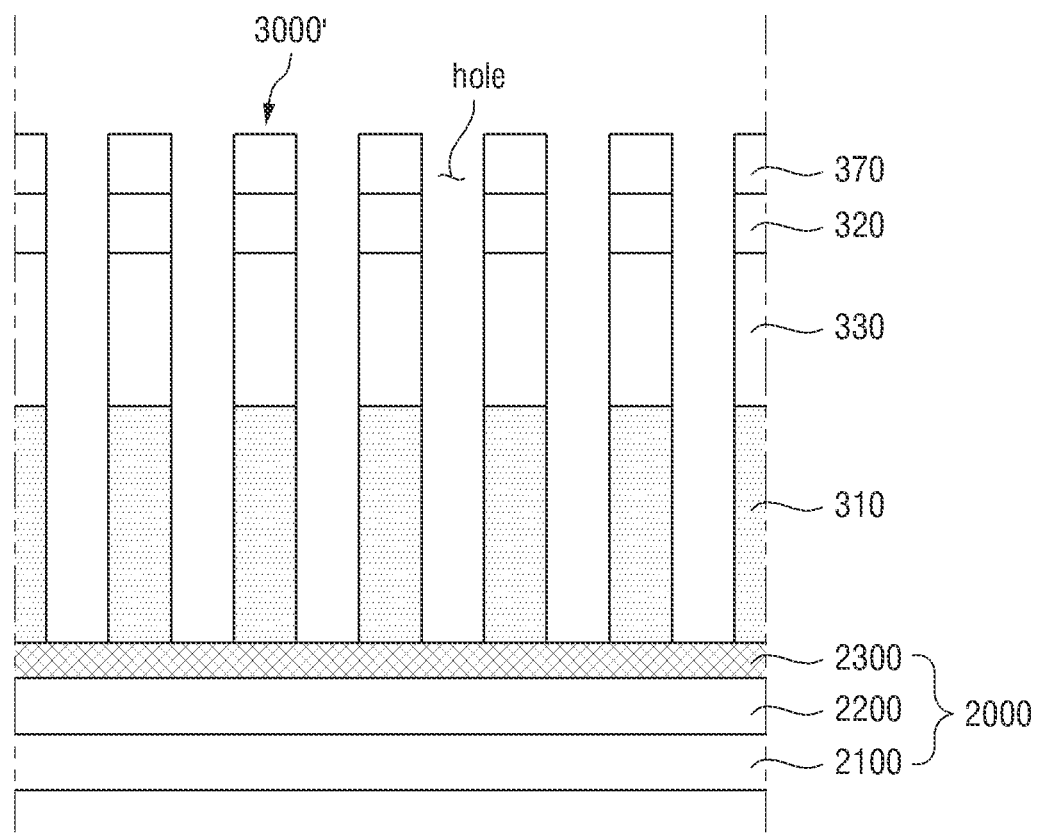

Next, referring to FIG. 7, the semiconductor structure 3000 is etched along the etch pattern layer 1700 to form the semiconductor crystals 3000'. The semiconductor crystals 3000' formed by etching the semiconductor structure 3000 may include the first semiconductor layers 310, the second semiconductor layers 320, the active layers 330, and the electrode layers 370 of the light emitting elements 300.

The process of etching the semiconductor structure 3000 may be performed using a conventional method. For example, the etching process may be dry etching, wet etching, reactive ion etching (RIE), inductively coupled plasma reactive ion etching (ICP-RIE), or the like. Dry etching may be suitable for vertical etching because anisotropic etching is possible. When the above etching methods are used, an etchant may be, but is not limited to, $Cl_2$ or $O_2$.

In the drawings, the semiconductor structure 3000 is etched in the direction perpendicular to the lower substrate 2000 to form etch holes, thereby forming the semiconductor crystals 3000'. However, the present disclosure is not limited thereto, and the forming of the semiconductor crystals 3000' may also be performed through a plurality of etching processes. This will not be described in detail.

Next, the semiconductor rods ROD are formed by forming the insulating films 380 partially around (or surrounding) outer side surfaces (e.g., outer peripheral or circumferential surfaces) of the semiconductor crystals 3000'.

Figure 8:
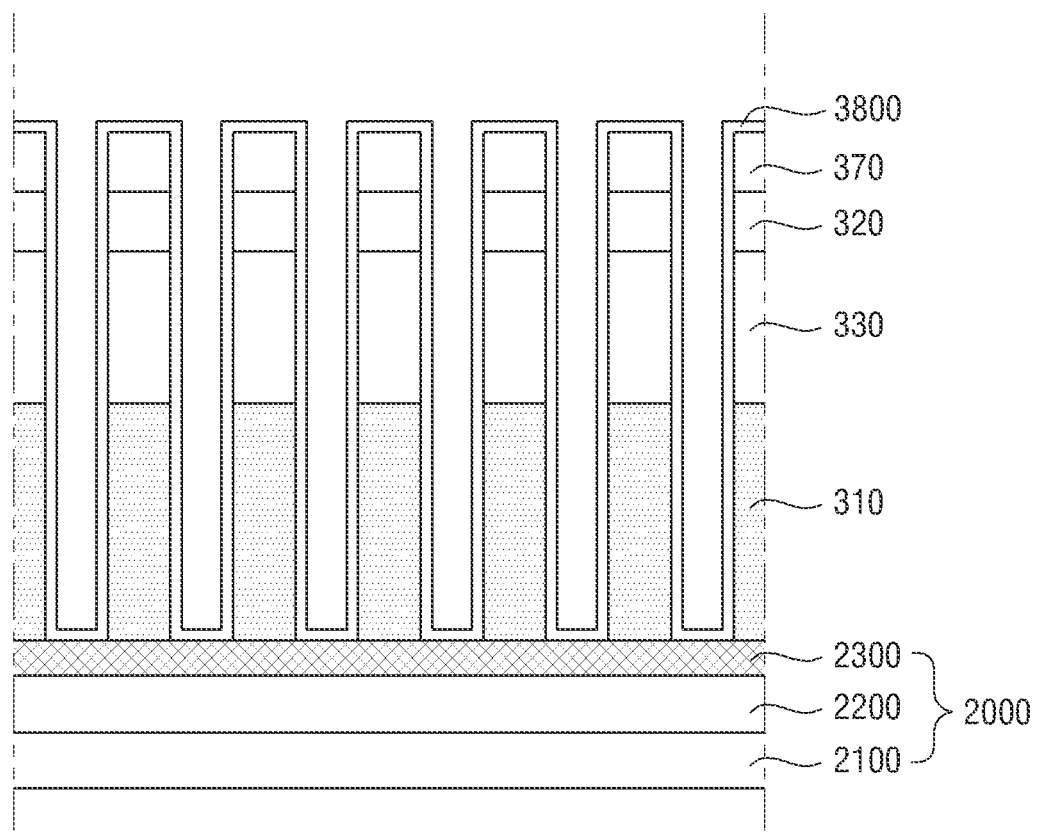
Figure 9:
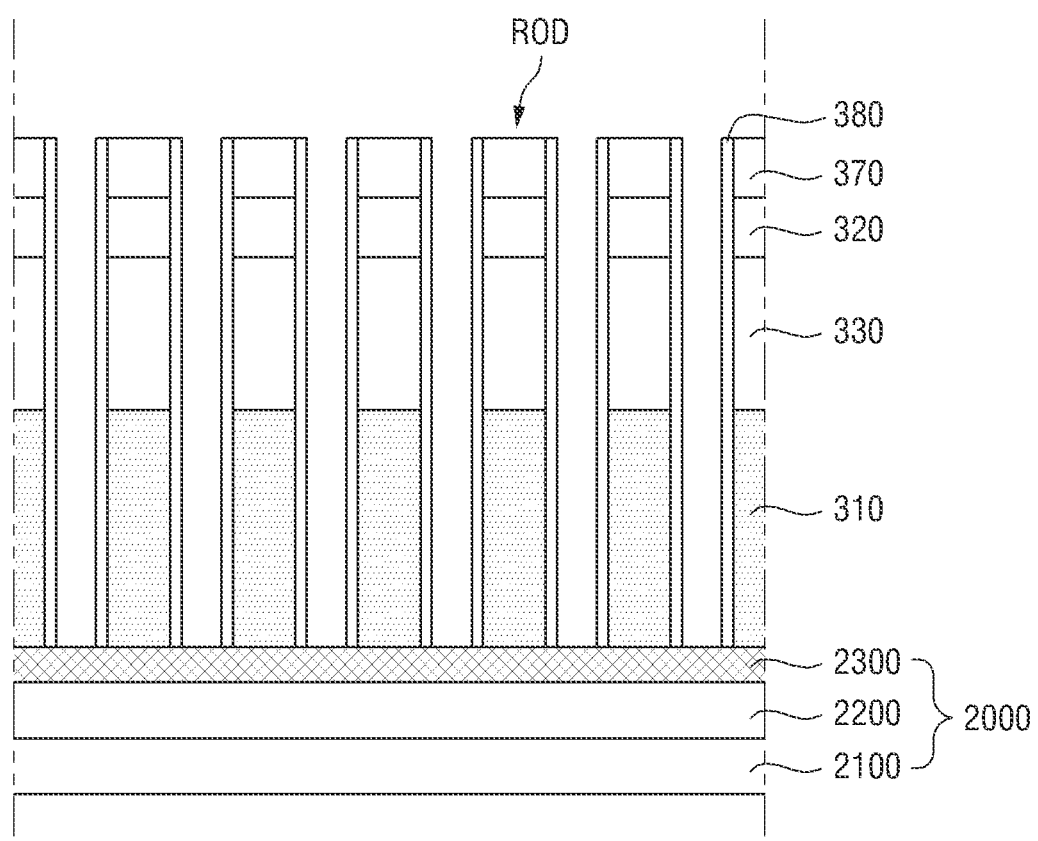

Referring to FIGS. 8 and 9, the insulating films 380 may be formed by forming an insulating film 3800 surrounding outer surfaces (e.g., outer peripheral or circumferential surfaces) of the semiconductor crystals 3000' and partially removing the insulating film 3800 to expose upper surfaces of the electrode layers 370.

The insulating film 3800 is an insulating material formed on outer surfaces (e.g., outer peripheral or circumferential surfaces) of the semiconductor rods ROD and may be formed by applying an insulating material on the outer surfaces of the vertically etched semiconductor crystals 3000' or using an immersion method. However, the present disclosure is not limited thereto. For example, the insulating film 3800 may be formed by atomic layer deposition (ALD).

The insulating film 3800 may be formed not only on the side surfaces and upper surfaces of the semiconductor crystals 3000' but also on the separation layer 2300 exposed between the semiconductor crystals 3000' spaced from each other. The insulating film 3800 may be partially removed in a subsequent process to expose the upper surfaces of the electrode layers 370, and at the same time, the insulating film 3800 disposed on the separation layer 2300 may also be partially removed. The insulating film 3800 may be partially removed by a process such as dry etching, which is anisotropic etching, or etch-back.

Figure 10:
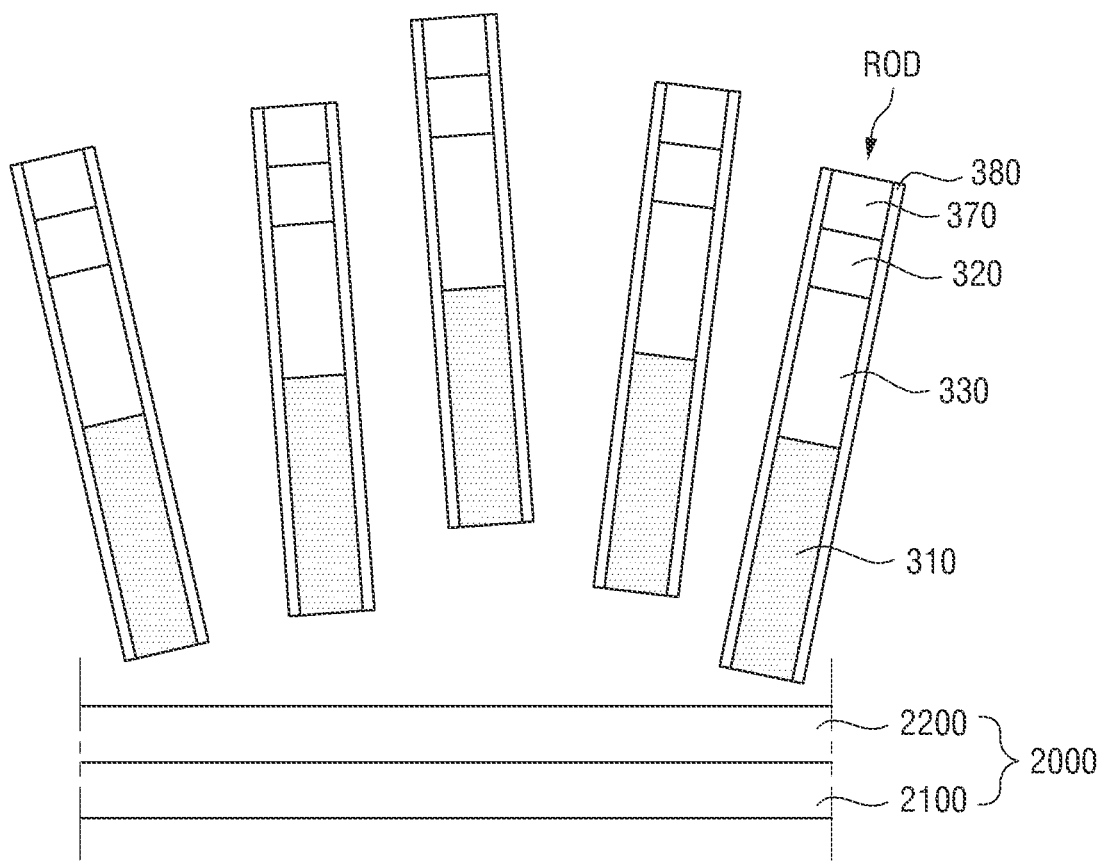

Next, referring to FIG. 10, the semiconductor rods ROD may be separated from the lower substrate 2000 by removing the separation layer 2300. The separating of the semiconductor rods ROD may include removing the separation layer 2300 using a chemical separation method (CLO). To remove the separation layer 2300, a wet etching process may be performed using a separation etchant such as hydrofluoric acid (HF) or buffered oxide etch (BOE), but the present disclosure is not limited thereto.

Figure 11:
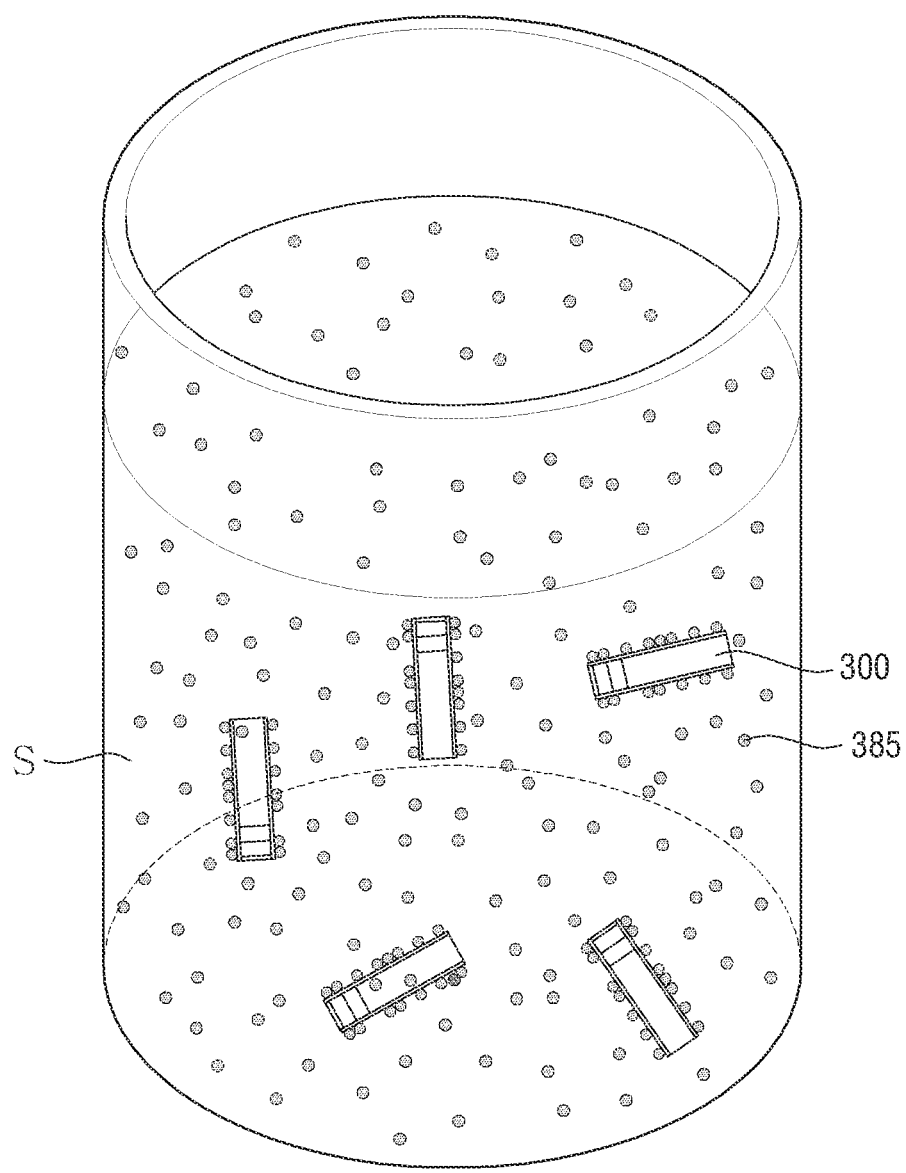

Next, referring to FIG. 11, the wavelength conversion materials 385 are formed on the insulating films 380 of the semiconductor rods ROD to manufacture the light emitting elements 300 according to one or more embodiments. The forming of the wavelength conversion materials 385 on the insulating films 380 is not particularly limited. In one or more embodiments, the method of manufacturing the light emitting elements 300 may include attaching the wavelength conversion materials 385 onto the insulating films 380 after separating the semiconductor rods ROD from the lower substrate 2000.

As described above, the wavelength conversion materials 385 may include quantum dot materials. For example, when the wavelength conversion materials 385 include quantum dot materials, the light emitting elements 300 may be manufactured by immersing the semiconductor rods ROD in a solution S in which the wavelength conversion materials 385 are dispersed so that the wavelength conversion materials 385 are attached on the insulating films 380. Here, the process of immersing the semiconductor rods ROD in the solution S may be performed after the semiconductor rods ROD are separated from the lower substrate 2000. The semiconductor rods ROD may be dispersed in the solution S, and the light emitting elements 300 may be formed as the wavelength conversion materials 385 are attached on the insulating films 380. However, the present disclosure is not limited thereto. For example, the semiconductor rods ROD may be immersed in the solution S in a state where they are attached to the lower substrate 2000. In this case, after the light emitting elements 300 are formed by attaching the wavelength conversion materials 385 on the insulating films 380, they may be separated from the lower substrate 2000.

Exposed outer surfaces of the insulating films 380, the electrode layers 370 and the first semiconductor layers 310 of the semiconductor rods ROD may contact the solution S in which the wavelength conversion materials 385 are dispersed. Unlike the electrode layers 370 and the first semiconductor layers 310, the insulating films 380 including an insulating material may form a relatively strong attractive force with the wavelength conversion materials 385. Accordingly, when the semiconductor rods ROD are immersed in the solution S, most of the wavelength conversion materials 385 may be attached to the outer surfaces of the insulating films 380.

As will be described later, a display device 10 according to one or more embodiments may include the light emitting elements 300 which include the wavelength conversion materials 385 described above. The light emitting elements 300 may be prepared in a state where they are dispersed in the solution S including the wavelength conversion materials 385 and may be sprayed on electrodes during a manufacturing process of the display device 10. That is, according to one or more embodiments, the light emitting elements 300 may be manufactured in a state where they are dispersed in the solution S together with the wavelength conversion materials 385. However, the present disclosure is not limited thereto.

In addition, in one or more embodiments, the wavelength conversion materials 385 may be attached to the insulating films 380 before the semiconductor rods ROD are separated from the lower substrate 2000. In some cases, the wavelength conversion materials 385 may be directly synthesized on the insulating film 380.

Figure 12:
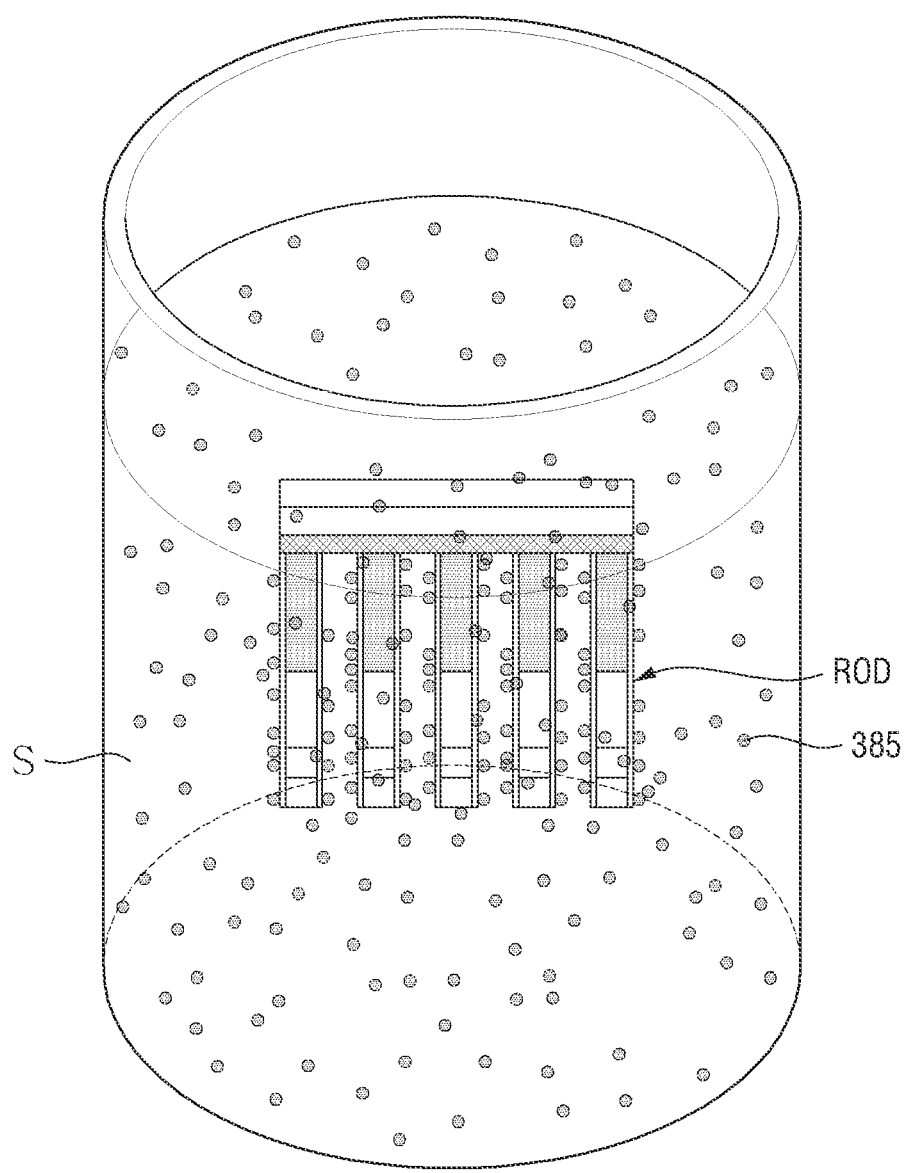
FIG. 12 is a schematic view illustrating a portion of a method of manufacturing light emitting elements according to one or more embodiments.

FIG. 12 is a schematic view illustrating a portion of a method of manufacturing light emitting elements according to one or more embodiments.

Referring to FIG. 12, a process of forming or attaching wavelength conversion materials 385 on insulating films 380 of semiconductor rods ROD may be performed before the semiconductor rods ROD are separated from a lower substrate 2000. Even if the semiconductor rods ROD are immersed in a solution S in a state where they are attached to the lower substrate 2000, most of the wavelength conversion materials 385 may be attached to the insulating films 380 while forming a relatively strong attractive force with the insulating films 380 of the semiconductor rods ROD.

The semiconductor rods ROD may be formed into light emitting elements 300 as the wavelength conversion materials 385 are attached to the insulating films 380, and the light emitting elements 300 may be separated from the lower substrate 2000 as a separation layer 2300 is removed in a subsequent process. The method of manufacturing the light emitting elements 300 illustrated in FIG. 12 is different from that of FIG. 10 in that the lower substrate 2000 to which the semiconductor rods ROD are attached is immersed in the solution S in which the wavelength conversion materials 385 are dispersed. This is the same as the above description and thus will not be described in detail.

Figure 13:
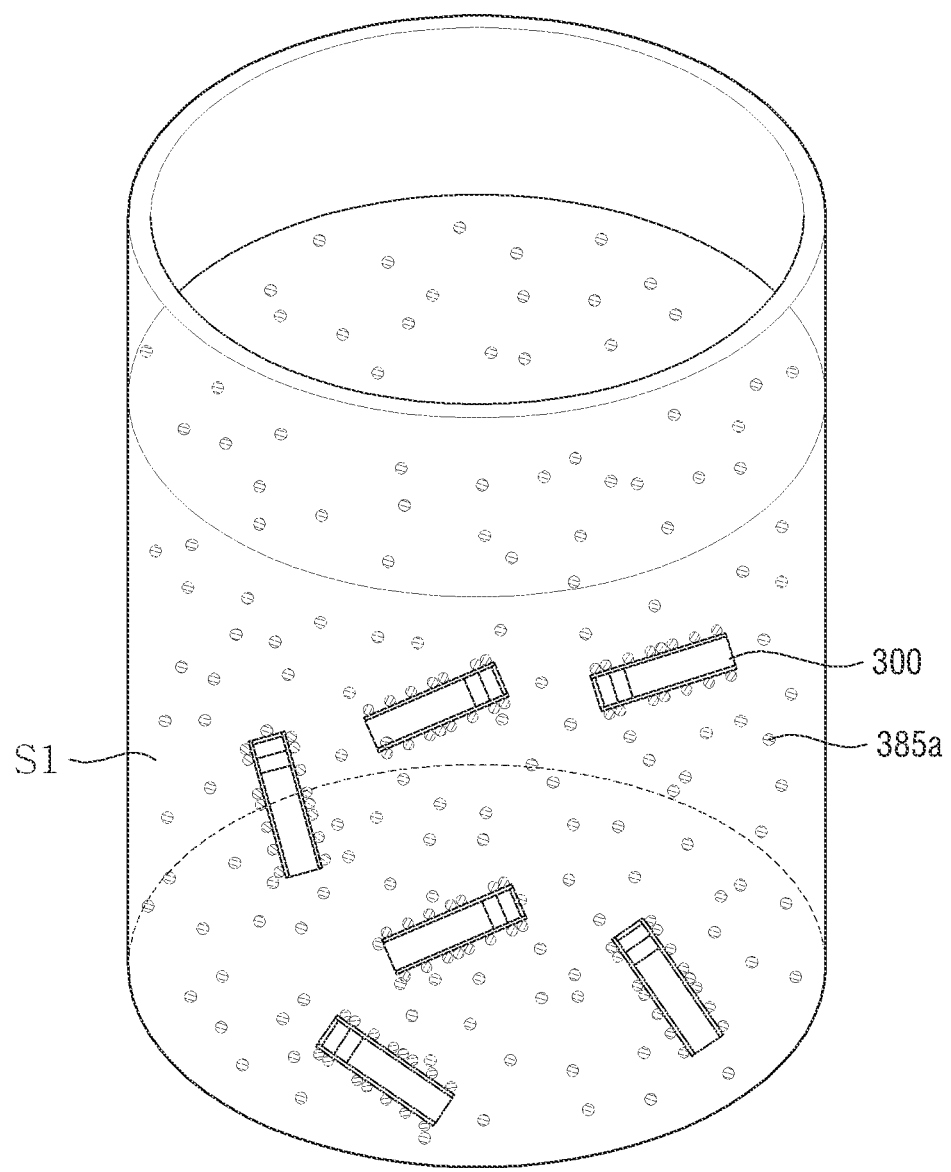
FIGS. 13 and 14 are schematic views illustrating a portion of a method of manufacturing light emitting elements according to one or more embodiments.
Figure 14:
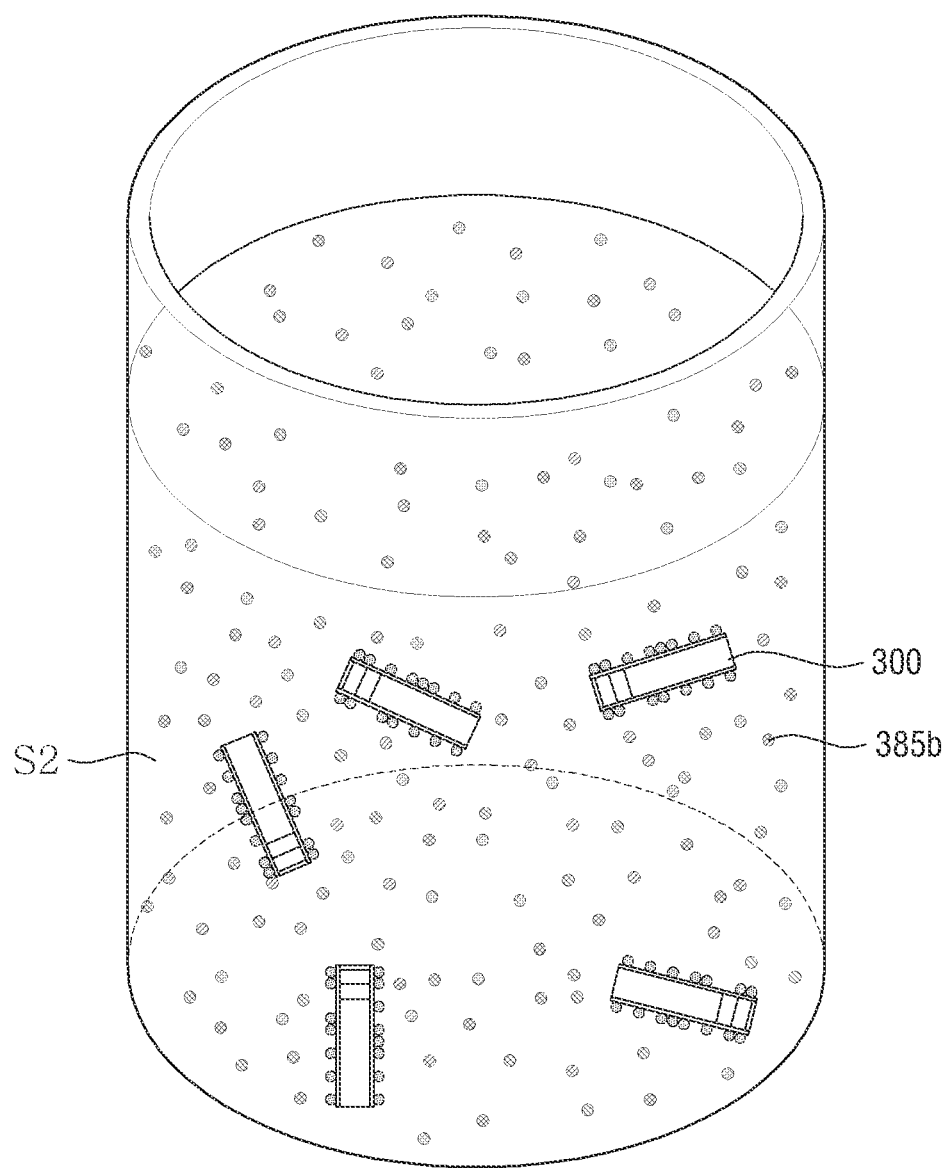

FIGS. 13 and 14 are schematic views illustrating a portion of a method of manufacturing light emitting elements according to one or more embodiments.

Referring to FIGS. 13 and 14, light emitting elements 300 according to one or more embodiments may be manufactured by directly synthesizing wavelength conversion materials 385 on insulating films 380. The method of manufacturing the light emitting elements 300 according to the current embodiment is the same as the embodiment of FIG. 11 except that the wavelength conversion materials 385 are synthesized on the insulating films 380. Therefore, any redundant description will be omitted below, and differences will be mainly described.

According to one or more embodiments, the wavelength conversion materials 385 may include quantum dot materials, and the quantum dot materials may have a core/shell structure in which one quantum dot is around (or surrounds) another quantum dot. The quantum dot materials having the core/shell structure may be formed by adsorbing first precursors 385a, which are materials forming core portions, to a target surface and then reacting second precursors 385b, which are materials forming shell portions, with the first precursors 385a.

First, as illustrated in FIG. 13, the semiconductor rods ROD including the insulating films 380 are immersed in a first solution S1 in which the first precursors 385a are dispersed. The first precursors 385a may be adsorbed while forming an attractive force with a material included in the insulating films 380 of the semiconductor rods ROD.

Next, as illustrated in FIG. 14, the semiconductor rods ROD having the first precursors 385a attached on the insulating films 380 are immersed in a solution S2 in which the second precursors 385b are dispersed, thereby forming the wavelength conversion materials 385. The second precursors 385b may react with the first precursors 385a attached to the insulating films 380 of the semiconductor rods ROD in the solution S2 to form the wavelength conversion materials 385. In this way, after the semiconductor rods ROD are separated from the lower substrate 2000, the light emitting elements 300 may be manufactured by directly synthesizing the wavelength conversion materials 385 on the insulating films 380. In one or more embodiments, the semiconductor rods ROD may be cleaned before the semiconductor rods ROD to which the first precursors 385a are adsorbed are immersed in the second solution S2. However, the present disclosure is not limited thereto.

The method of manufacturing the light emitting elements 300 described above with reference to FIGS. 13 and 14 may also be equally applied to the method described above with reference to FIG. 12. That is, the light emitting elements 300 may also be manufactured by forming the wavelength conversion materials 385 by performing a process of successively immersing the semiconductor rods ROD in the first solution S1 and the second solution S2 before separating the semiconductor rods ROD from the lower substrate 2000 and then separating the semiconductor rods ROD from the lower substrate 2000. This will not be described in detail.

The light emitting elements 300 according to one or more embodiments may be manufactured through the above-described method. Each of the light emitting elements 300 may include an active layer 330 emitting light in a specific wavelength through the same epitaxial growth process, but the wavelength band of light emitted to the outside may vary according to the wavelength conversion materials 385 disposed on the insulating film 380. According to one or more embodiments, in the method of manufacturing the light emitting elements 300, even if the same active layer 330 is included by performing only the same epitaxial growth process, light emitting elements 300 emitting light of various colors may be manufactured by changing the type of the wavelength conversion materials 385. Accordingly, the manufacturing process cost of the light emitting elements 300 may be reduced, and the production yield may be improved.

Light emitting elements 300 according to one or more embodiments will now be described.

Figure 15:
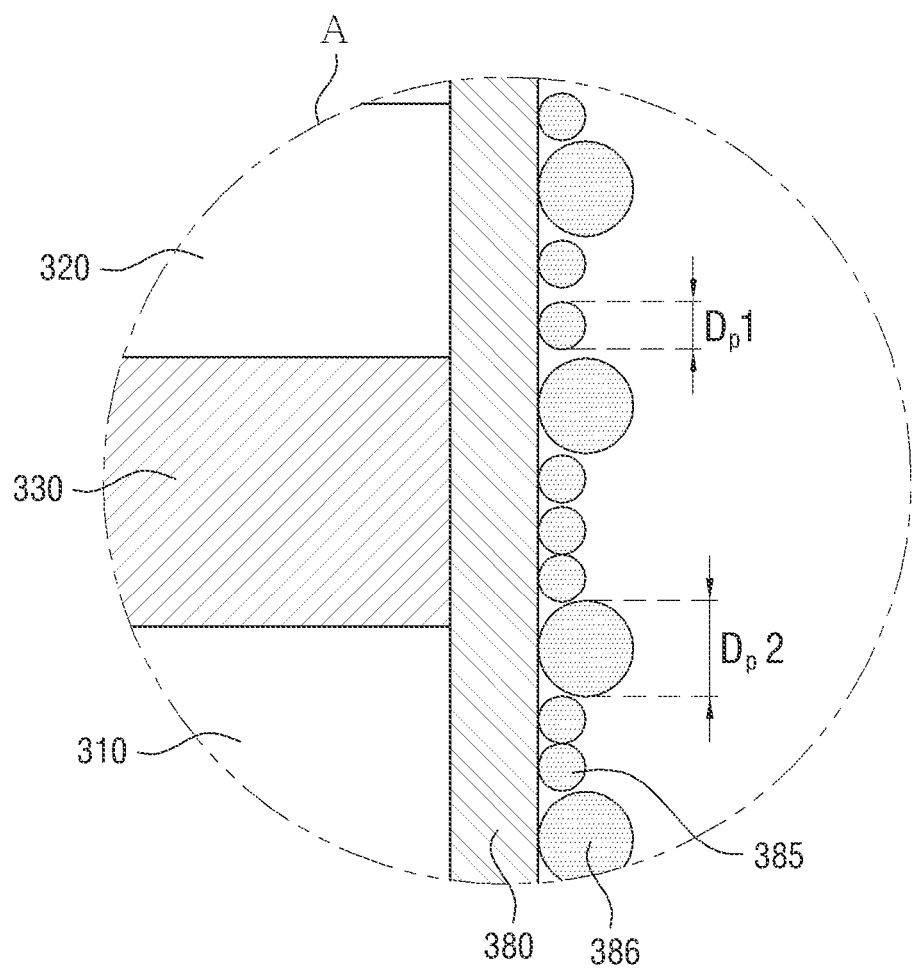
FIG. 15 is an enlarged schematic view of an insulating film of a light emitting element according to one or more embodiments.
Figure 16:
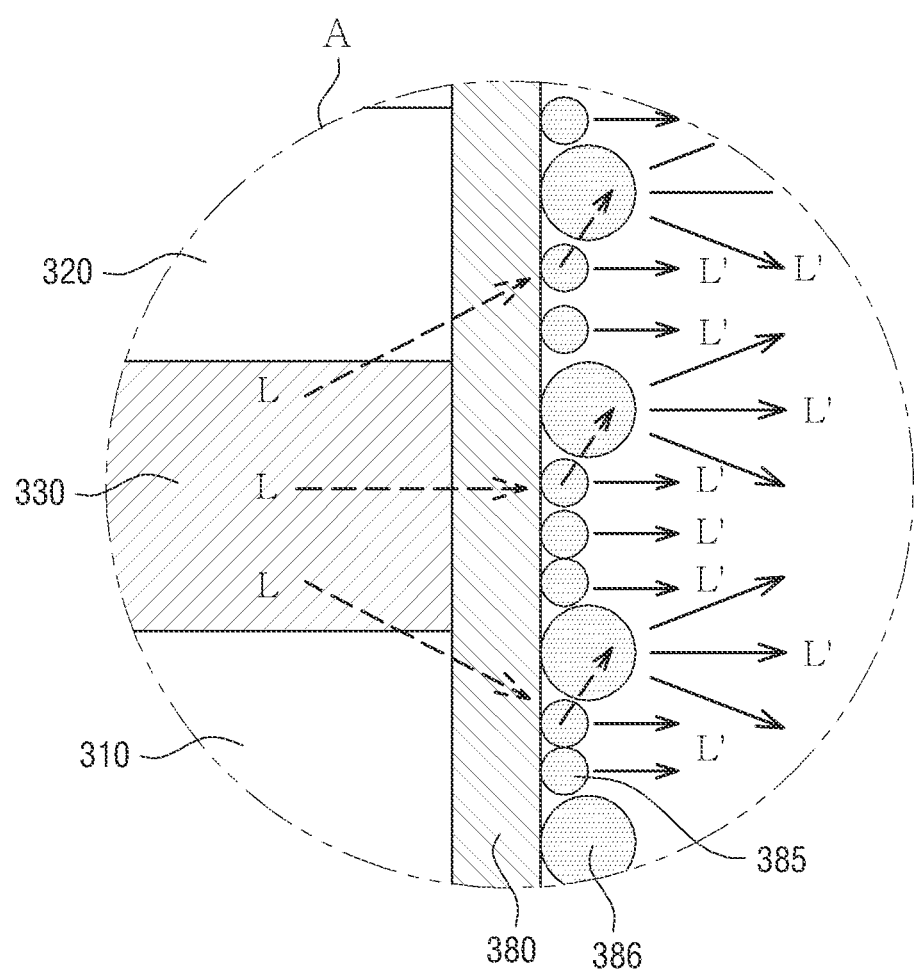
FIG. 16 is a schematic diagram illustrating light emitted from the light emitting element of FIG. 15.

FIG. 15 is an enlarged schematic view of an insulating film of a light emitting element according to one or more embodiments. FIG. 16 is a schematic diagram illustrating light emitted from the light emitting element of FIG. 15.

Referring to FIGS. 15 and 16, a light emitting element 300 according to one or more embodiments may further include scatterers 386 disposed on an insulating film 380. The light emitting element 300 according to the current embodiment is the same as the light emitting element 300 of FIG. 1 except that it further includes the scatterers 386. Therefore, any redundant description will be omitted below, and differences will be mainly described.

The scatterers 386 according to one or more embodiments may include a material that can scatter at least a portion of incident light. For example, the scatterers 386 may be light scattering particles. In some embodiments, the scatterers 386 may be metal oxide particles or organic particles. The metal oxide may be, for example, titanium oxide ($TiO_2$), zirconium oxide ($ZrO_2$), aluminum oxide ($Al_2O_3$), indium oxide ($In_2O_3$), zinc oxide (ZnO) or tin oxide ($SnO_2$), and the material of the organic particles may be, for example, acrylic resin or urethane resin. The scatterers 386 according to one or more embodiments may have a diameter Dp2 greater than a diameter Dp1 of wavelength conversion materials 385, but the present disclosure is not limited thereto.

The scatterers 386 may scatter light in random directions regardless of the incident direction of the light L' without substantially converting the wavelength of the light L' emitted from the wavelength conversion materials 385. As illustrated in FIG. 16, at least a portion of light L emitted from an active layer 330 of the light emitting element 300 may enter the wavelength conversion materials 385, and the wavelength conversion materials 385 may convert the light L into the light L' having a different central wavelength band and emit the light L'. The light L' emitted from the wavelength conversion materials 385 may travel in random directions regardless of the incident direction of the light L incident from the active layer 330, and at least a portion of the light L' may enter the scatterers 386. The scatterers 386 may scatter the light L' emitted and incident from the wavelength conversion materials 385 in random directions regardless of the incident direction of the light L'. Accordingly, the light emitting element 300 according to one or more embodiments may emit the light L' in random directions from side surfaces of the insulating film 380, and lateral visibility of the light L' emitted from the light emitting element 300 may be improved.

Figure 17:
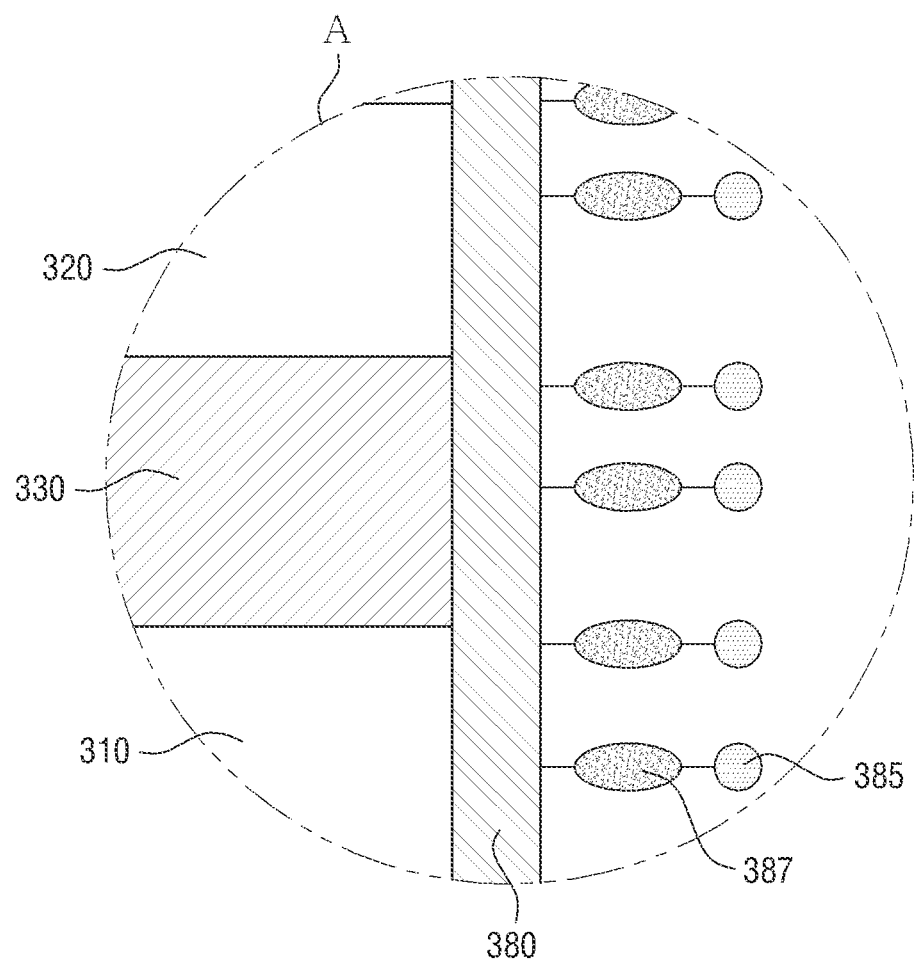
FIG. 17 is an enlarged schematic view of an insulating film of a light emitting element according to one or more embodiments.

FIG. 17 is an enlarged schematic view of an insulating film of a light emitting element according to one or more embodiments.

Referring to FIG. 17, a light emitting element 300 according to one or more embodiments may further include ligands 387 bound to an insulating film 380, and wavelength conversion materials 385 may be bound to the ligands 387. The light emitting element 300 according to the current embodiment is the same as the light emitting element 300 of FIG. 1 except that it further includes the ligands 387 bound to the insulating film 380 and the wavelength conversion materials 385 bound to the ligands 387. Therefore, any redundant description will be omitted below, and differences will be mainly described.

As described above, an outer surface of the insulating film 380 may be treated. The surface of the insulating film 380 may be treated so that the light emitting element 300 remains separate from other light emitting elements 300 without being agglomerated with them in ink. However, in one or more embodiments, the surface of the insulating film 380 may be treated to bind the ligands 387 to the insulating film 380 of the light emitting element 300.

The wavelength conversion materials 385 of the light emitting element 300 may be physically or chemically adsorbed and disposed on the insulating film 380. When the number of wavelength conversion materials 385 disposed on the insulating film 380 is not sufficient, at least a portion of light emitted from an active layer 330 of the light emitting element 300 may be emitted to the outside without entering the wavelength conversion materials 385. In this case, light emitted from the active layer 330 and light converted by the wavelength conversion materials 385 may be mixed and emitted from the light emitting element 300, and the color purity of the light emitting element 300 may be lowered. Because the light emitting element 300 according to the embodiment further includes the ligands 387 that are bound to the insulating film 380 and capable of forming a chemical bond with the wavelength conversion materials 385, the density of the wavelength conversion materials 385 disposed on the insulating film 380 may be increased.

The type of the ligands 387 is not particularly limited. Although not specifically illustrated in the drawing, in one or more embodiments, the ligands 387 may include a first functional group capable of forming a chemical bond with a material included in the insulating film 380 an a second functional group capable of forming a chemical bond with the wavelength conversion materials 385. However, the present disclosure is not limited thereto.

The structure of the light emitting element 300 is not limited to that illustrated in FIG. 1, and the light emitting element 300 may also have other structures.

Figure 18:
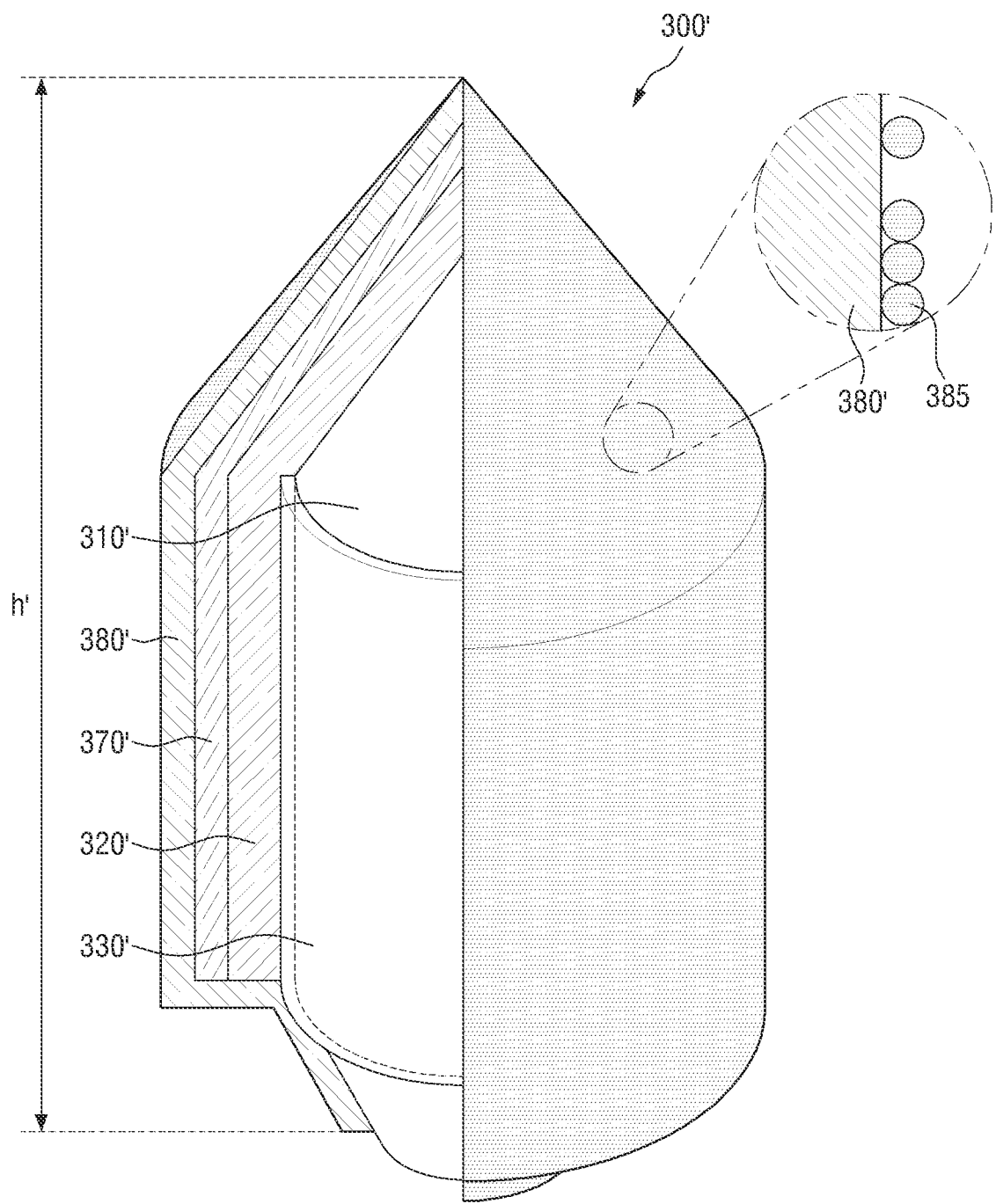
FIG. 18 is a schematic cutaway view of a light emitting element according to one or more embodiments.

FIG. 18 is a schematic cutaway view of a light emitting element according to one or more embodiments.

Referring to FIG. 18, the light emitting element 300' may extend in a direction but may have partially inclined side surfaces. That is, the light emitting element 300' according to one or more embodiments may have a partially conical shape. In the light emitting element 300', a plurality of layers may not be stacked in one direction, but each layer may be formed to be around (or to surround) an outer surface of another layer. The light emitting element 300' of FIG. 18 is the same as the light emitting element 300 of FIG. 1 except that the shape of each layer is partially different. Therefore, any redundant description will be omitted below, and differences will be mainly described According to one or more embodiments, a first semiconductor layer 310' may extend in a direction and have both ends inclined toward the center. The first semiconductor layer 310' of FIG. 18 may have a rod-shaped or cylindrical body and conical ends formed on and under the body, respectively. An upper end of the body may have a steeper slope than a lower end thereof.

An active layer 330' is around (or surrounds) an outer surface of the body of the first semiconductor layer 310'. The active layer 330' may have an annular shape extending in a direction. The active layer 330' may not be formed on the upper and lower ends of the first semiconductor layer 310'. That is, the active layer 330' may contact only parallel side surfaces of the first semiconductor layer 310'.

A second semiconductor layer 320' is around (or surrounds) an outer surface of the active layer 330' and the upper end of the first semiconductor layer 310'. The second semiconductor layer 320' may include an annular body extending in a direction and an upper end having inclined side surfaces. That is, the second semiconductor layer 320' may directly contact parallel side surfaces of the active layer 330' and the inclined upper end of the first semiconductor layer 310'. However, the second semiconductor layer 320' is not formed on the lower end of the first semiconductor layer 310'.

An electrode layer 370' is around (or surrounds) an outer surface of the second semiconductor layer 320'. The shape of the electrode layer 370' may be substantially the same as that of the second semiconductor layer 320'. That is, the electrode layer 370' may contact the entire outer surface of the second semiconductor layer 320'.

An insulating film 380' may be around (or surround) outer surfaces of the electrode layer 370' and the first semiconductor layer 310'. The insulating film 380' may directly contact not only the electrode layer 370' but also the lower end of the first semiconductor layer 310' and exposed lower ends of the active layer 330' and the second semiconductor layer 320'.

As described above, a light emitting element 300' may include wavelength conversion materials 385' or scatterers 386' to convert light L emitted from an active layer 330' into light L' having a different wavelength band and emit the light L'. In addition, according to one or more embodiments, a display device 10 may include at least one light emitting element 300/300' to display light in a specific wavelength band.

Figure 19:
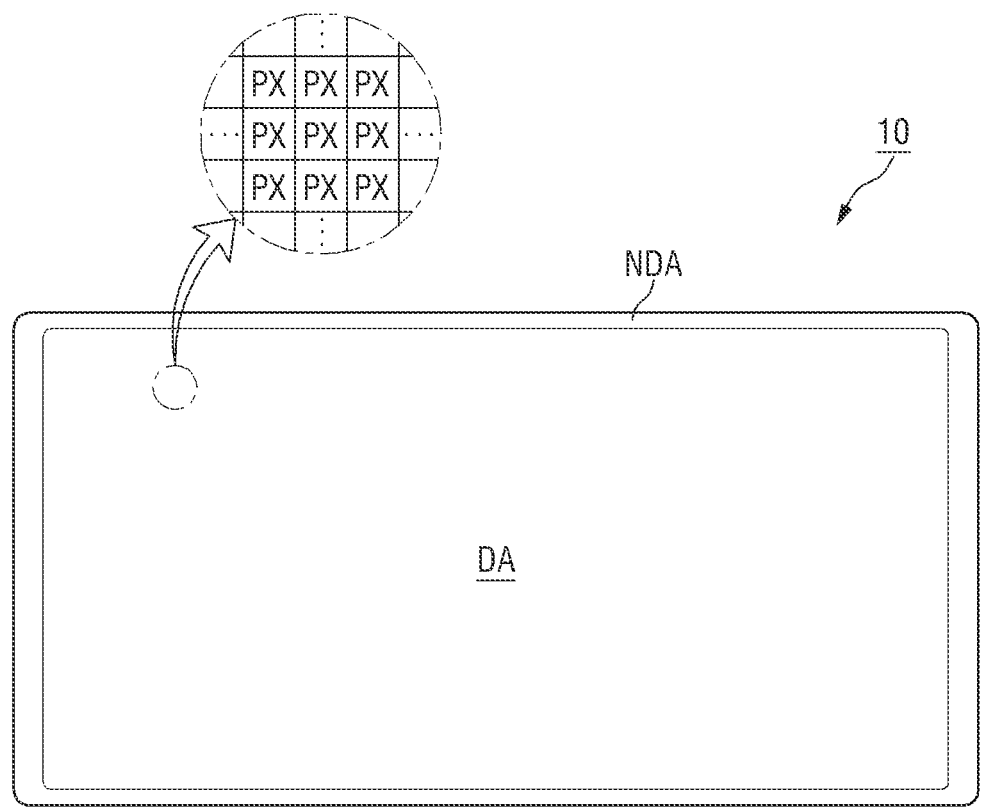
FIG. 19 is a schematic view of a display device according to one or more embodiments.

FIG. 19 is a schematic plan view of a display device according to one or more embodiments.

Referring to FIG. 19, the display device 10 displays moving images or still images. The display device 10 may refer to any electronic device that provides a display screen. Examples of the display device 10 may include televisions, notebook computers, monitors, billboards, the Internet of things (IoT), mobile phones, smartphones, tablet personal computers (PCs), electronic watches, smart watches, watch phones, head mounted displays, mobile communication terminals, electronic notebooks, electronic books, portable multimedia players (PMPs), navigation devices, game machines, digital cameras and camcorders, all of which provide a display screen.

The display device 10 includes a display panel that provides a display screen. Examples of the display panel may include light emitting diode display panels, organic light emitting display panels, quantum dot light emitting display panels, plasma display panels, and field emission display panels. A case where a light emitting diode display panel is applied as an example of the display panel will be described below, but the present disclosure is not limited to this case, and other display panels can also be applied as long as the same technical spirit is applicable.

The shape of the display device 10 can be variously modified. For example, the display device 10 may have various shapes such as a horizontally long rectangle, a vertically long rectangle, a square, a quadrangle with rounded corners (vertices), other polygons, and a circle. The shape of a display area DA of the display device 10 may also be similar to the overall shape of the display device 10. In FIG. 19, the display device 10 and the display area DA have a horizontally long rectangular shape.

The display device 10 may include the display area DA and a non-display area NDA. The display area DA may be an area where an image may be displayed, and the non-display area NDA may be an area where no image is displayed. The display area DA may also be referred to as an active area, and the non-display area NDA may also be referred to as an inactive area. The non-display area NDA may be around (or surround) the display area along the edge or periphery of the display area DA.

The display area DA may generally occupy the center (or central region) of the display device 10. The display area DA may include a plurality of pixels PX. The pixels PX may be arranged in a matrix direction. For example, the pixels PX may be arranged along the rows and columns of a matrix. Each of the pixels PX may be rectangular or square in a plan view. However, the present disclosure is not limited thereto, and each of the pixels PX may also have a rhombus shape having each side inclined with respect to a first direction DR1. Each of the pixels PX may display a specific color by including one or more light emitting elements 300/300' which emit light of a specific wavelength band.

Figure 20:
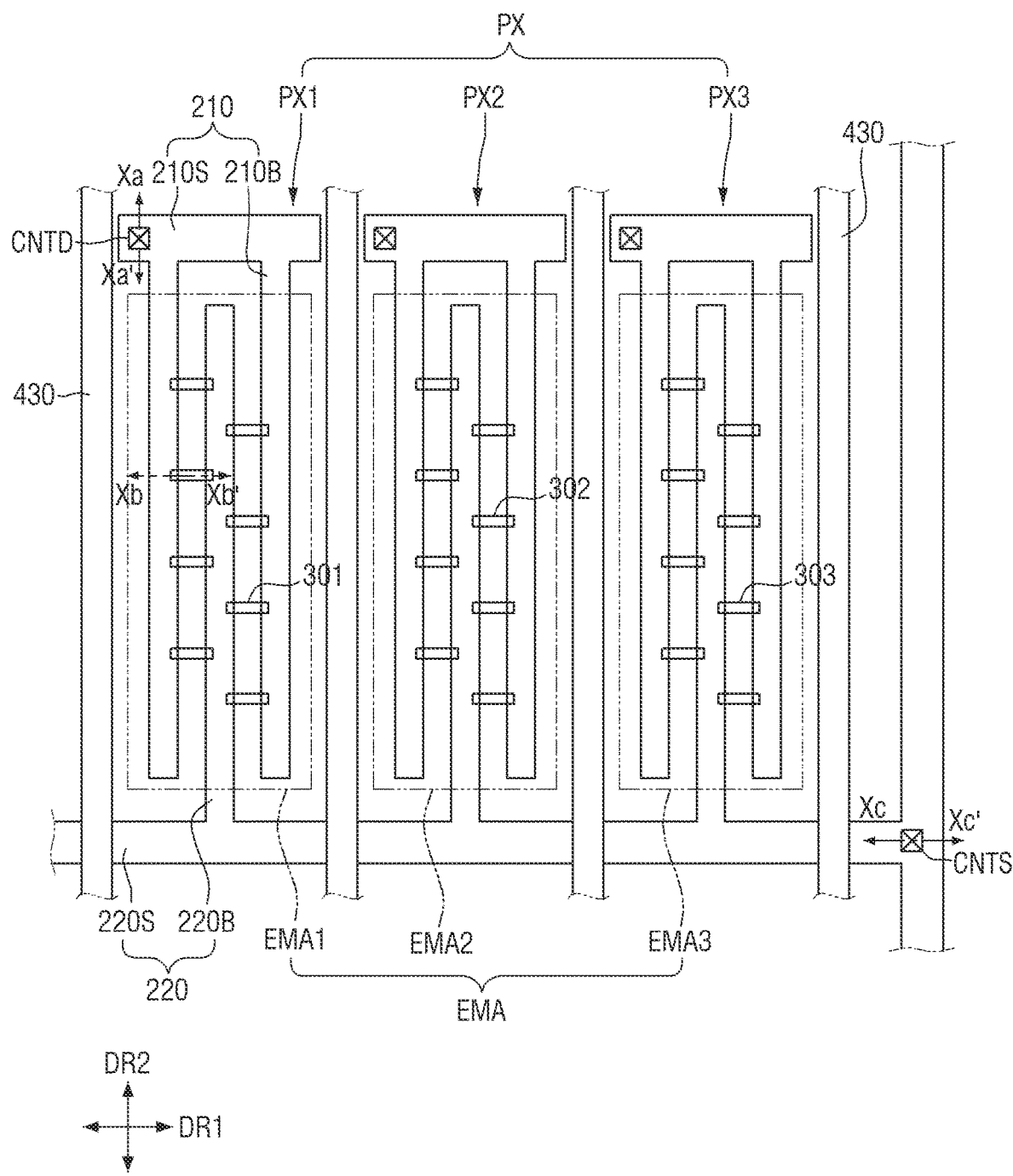
FIG. 20 is a schematic plan view of a pixel of the display device according to one or more embodiments.

FIG. 20 is a schematic plan view of a pixel of the display device according to one or more embodiments.

Referring to FIG. 20, each of the pixels PX may include a first subpixel PX1, a second subpixel PX2, and a third subpixel PX3. The first subpixel PX1 may emit light of a first color, the second subpixel PX2 may emit light of a second color, and the third subpixel PX3 may emit light of a third color. The first color may be blue, the second color may be green, and the third color may be red. However, the present disclosure is not limited thereto, and the subpixels PXn may also emit light of the same color. In addition, although a pixel PX includes three subpixels PXn in FIG. 20, the present disclosure is not limited thereto, and the pixel PX may also include more subpixels PXn.

It will be understood that, although the terms first, second, third, etc., may be used herein to describe various elements, these elements should not be limited by these terms. These terms are only used to distinguish one element from another element. That is, elements defined as first, second, etc. are not necessarily limited to a specific structure or location and, in some cases, may be assigned other numerical terms. Thus, the number assigned to each element may be described through the drawings and the following description, and a first element discussed below could be termed a second element without departing from the teachings of the disclosure.

Each subpixel PXn of the display device 10 may include an area defined as an emission area EMA. The first subpixel PX1 may include a first emission area EMA1, the second subpixel PX2 may include a second emission area EMA2, and the third subpixel PX3 may include a third emission area EMA3. The emission area EMA may be defined as an area where light emitting elements 300 included in the display device 10 are disposed to emit light of a specific wavelength band. Each of the light emitting elements 300 may include an active layer 330, and the active layer 330 may emit light of a specific wavelength band without directionality. That is, light emitted from the active layer 330 of each light emitting element 300 may be radiated in the lateral direction of the light emitting element 300 as well as toward both ends of the light emitting element 300. The emission area EMA of each subpixel PXn may include an area in which the light emitting elements 300 are disposed and an area which is adjacent to the light emitting elements 300 and from which light emitted from the light emitting elements 300 is output. In addition, the present disclosure is not limited thereto, and the emission area EMA may also include an area from which light emitted from the light emitting elements 300 is output after being reflected or refracted by other members. A plurality of light emitting elements 300 may be disposed in each subpixel PXn, and an area where the light emitting elements 300 are disposed and an area adjacent to this area may form the emission area EMA.

Although not illustrated in the drawing, each subpixel PXn of the display device 10 may include a non-emission area defined as an area other than the emission area EMA. The non-emission area may be an area in which the light emitting elements 300 are not disposed and from which no light is output because light emitted from the light emitting elements 300 does not reach this area.

Figure 22:
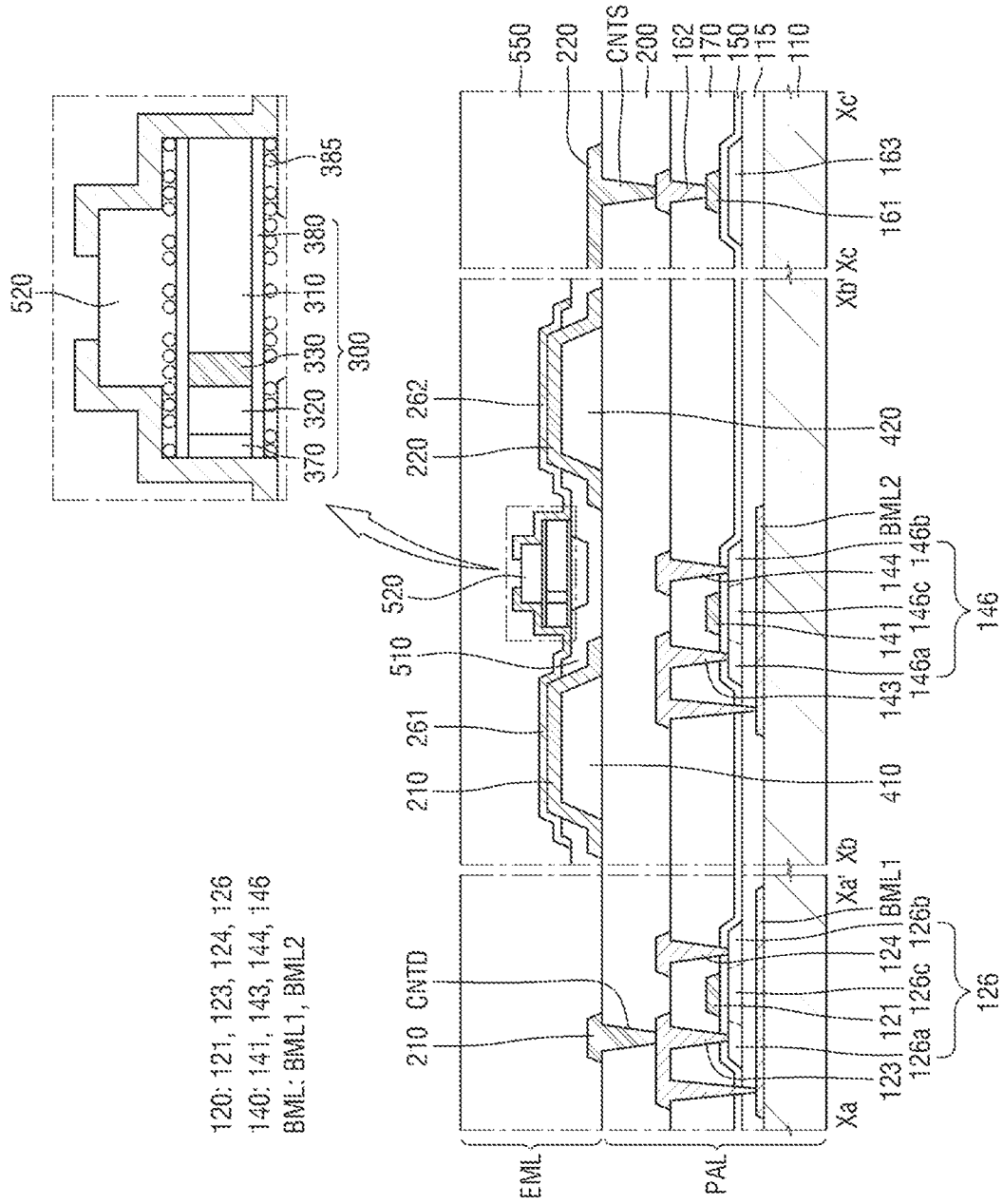
FIG. 22 is a cross-sectional view taken along the lines Xa-Xa', Xb-Xb' and Xc-Xc' of FIG. 20.
Figure 23:
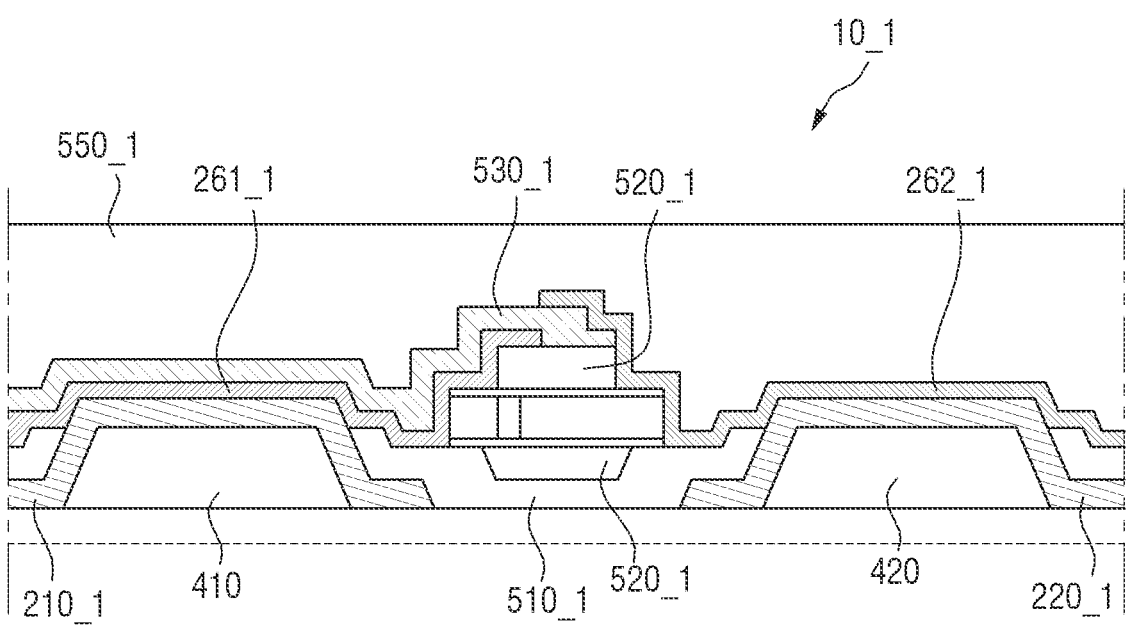
FIG. 23 is a cross-sectional view of a display device according to one or more embodiments.

Each subpixel PXn of the display device 10 may include a plurality of electrodes 210 and 220, the light emitting elements 300, a plurality of banks 410, 420 and 430 (see FIG. 22), and one or more insulating layers 510, 520 and 550 (see FIGS. 22-23).

The electrodes 210 and 220 may be electrically connected to the light emitting elements 300 and may receive a suitable voltage (e.g., a predetermined voltage) so that the light emitting elements 300 can emit light of a specific wavelength band. In addition, at least a portion of each of the electrodes 210 and 220 may be utilized to form an electric field in a subpixel PXn to align the light emitting elements 300.

The electrodes 210 and 220 may include a first electrode 210 and a second electrode 220. In one or more embodiments, the first electrode 210 may be a pixel electrode separate for each subpixel PXn, and the second electrode 220 may be a common electrode commonly connected along each subpixel PXn. Any one of the first electrode 210 and the second electrode 220 may be anodes of the light emitting elements 300, and the other may be cathodes of the light emitting elements 300. However, the present disclosure is not limited thereto, and the opposite may also be the case.

Each of the first electrode 210 and the second electrode 220 may include an electrode stem portion 210S or 220S extending in the first direction DR1 and at least one electrode branch portion 210B or 220B extending and branching from the electrode stem portion 210S or 220S in a second direction DR2 intersecting the first direction DR1.

The first electrode 210 may include a first electrode stem portion 210S extending in the first direction DR1 and at least one first electrode branch portion 210B branching from the first electrode stem portion 210S and extending in the second direction DR2.

The first electrode stem portion 210S of any one pixel may have both ends ending between subpixels PXn and spaced from ends of neighboring first electrode stem portions 210S but may lie on substantially the same straight line as the first electrode stem portions 210S of neighboring subpixels (e.g., adjacent in the first direction DR1) in the same row. Because both ends of the first electrode stem portions 210S respectively disposed in the subpixels PXn are spaced from each other, a different electrical signal may be transmitted to each first electrode branch portion 210B, and each first electrode branch portion 210B may be driven separately.

The first electrode branch portion 210B may branch from at least a portion of the first electrode stem portion 210S and extend in the second direction DR2 to end at a position spaced from a second electrode stem portion 220S facing the first electrode stem portion 210S.

The second electrode 220 may include the second electrode stem portion 220S extending in the first direction DR1 and spaced from the first electrode stem portion 210S in the second direction DR2 to face the first electrode stem portion 210S and a second electrode branch portion 220B branching from the second electrode stem portion 220S and extending in the second direction DR2. The other end of the second electrode stem portion 220S may be connected to the second electrode stem portion 220S of another subpixel PXn adjacent in the first direction DR1. That is, unlike the first electrode stem portion 210S, the second electrode stem portion 220S may extend in the first direction DR1 to cross the subpixels PXn. The second electrode stem portion 220S crossing the subpixels PXn may be connected to a peripheral portion of the display area DA in which each pixel PX or subpixel PXn is disposed or a portion extending in a direction in the non-display area NDA.

The second electrode branch portion 220B may be spaced from the first electrode branch portion 210B to face the first electrode branch portion 210B and may end at a position spaced from the first electrode stem portion 210S. The second electrode branch portion 220B may be connected to the second electrode stem portion 220S, and an end in the extending direction may be spaced from the first electrode stem portion 210S in each subpixel PXn.

Although two first electrode branch portions 210B are disposed in each subpixel PXn and one second electrode branch portion 220B is disposed between them in the drawing, the present disclosure is not limited thereto. In addition, the first electrode 210 and the second electrode 220 may not necessarily extend in one direction and may be disposed in various structures. For example, the first electrode 210 and the second electrode 220 may be partially curved or bent, or any one of the first electrode 210 and the second electrode 220 may be around (or surround) the other electrode. The structure or shape in which the first electrode 210 and the second electrode 220 are disposed is not particularly limited as long as the first electrode 210 and the second electrode 220 are at least partially spaced to face each other so that a space in which the light emitting elements 300 are to be disposed may be formed between the first electrode 210 and the second electrode 220.

In addition, the first electrode 210 and the second electrode 220 may be electrically connected to a circuit element layer PAL (see FIG. 22) of the display device 10 through corresponding contact holes, for example, a first electrode contact hole CNTD and a second electrode contact hole CNTS, respectively. In the drawing, the first electrode contact hole CNTD is formed in the first electrode stem portion 210S of each subpixel PXn, and only one second electrode contact hole CNTS is formed in one second electrode stem portion 220S crossing the subpixels PXn. However, the present disclosure is not limited thereto. In some cases, the second electrode contact hole CNTS may also be formed in each subpixel PXn.

The banks 410, 420, and 430 (e.g., see FIG. 22) may include an outer bank 430 disposed at a boundary between the subpixels PXn and a plurality of inner banks 410 and 420 disposed adjacent to the center of each subpixel PXn and under the electrodes 210 and 220, respectively. Although the inner banks 410 and 420 are not illustrated in FIG. 20, a first inner bank 410 and a second inner bank 420 may be disposed under the first electrode branch portion 210B and the second electrode branch portion 220B, respectively. These will be described later with reference to other drawings.

The outer bank 430 may be disposed at the boundary between the subpixels PXn. Respective ends of a plurality of first electrode stem portions 210S may be spaced from each other by the outer bank 430. The outer bank 430 may extend in the second direction D2 to lie at the boundary between the subpixels PXn arranged along the first direction D1. However, the present disclosure is not limited thereto, and the outer bank 430 may also extend in the first direction D1 to lie at the boundary between the subpixels PXn arranged along the second direction D2. The outer bank 430 may include the same material as the inner banks 410 and 420 and may be formed at the same time as the inner banks 410 and 420 in one process.

A plurality of light emitting elements 300 may be disposed between the first electrode 210 and the second electrode 220. As illustrated in the drawing, the light emitting elements 300 may be disposed between the first electrode branch portion 210B and the second electrode branch portion 220B. Ends of at least some of the light emitting elements 300 may be electrically connected to the first electrode 210, and the other ends may be electrically connected to the second electrode 220. Both ends of each light emitting element 300 may lie on the first electrode branch portion 210B and the second electrode branch portion 220B, but the present disclosure is not limited thereto. In one or more embodiments, the light emitting elements 300 may be disposed between the first electrode 210 and the second electrode 220 such that both ends do not overlap the first electrode 210 and the second electrode 220.

The light emitting elements 300 may be spaced from each other between the electrodes 210 and 220 along the second direction DR2 and may be aligned substantially parallel to each other. A gap between the light emitting elements 300 is not particularly limited. In one or more embodiments, a plurality of light emitting elements 300 may be disposed adjacent to each other to form a group, and a plurality of other light emitting elements 300 may form a group at a certain distance from the above group or may be oriented and aligned in a direction with non-uniform density. In addition, in one or more embodiments, the light emitting elements 300 may extend in a direction, and the direction in which each electrode, for example, the first electrode branch portion 210B and the second electrode branch portion 220B extend and the direction in which the light emitting elements 300 extend may be substantially perpendicular to each other. However, the present disclosure is not limited thereto, and the light emitting elements 300 may also extend in a direction not perpendicular but oblique to the direction in which the first electrode branch portion 210B and the second electrode branch portion 220B extend.

The light emitting elements 300 according to one or more embodiments may include wavelength conversion materials 385 to emit light of different wavelength bands even if they include the same active layer 330. The display device 10 according to one or more embodiments may include first light emitting elements 301 in which light emitted from the active layers 330 and light emitted out of the light emitting elements 300 are the same and second light emitting elements 302 and third light emitting elements 303 in which light emitted from the active layers 330 and light emitted out of the light emitting elements 300 have different central wavelength bands.

Figure 21:
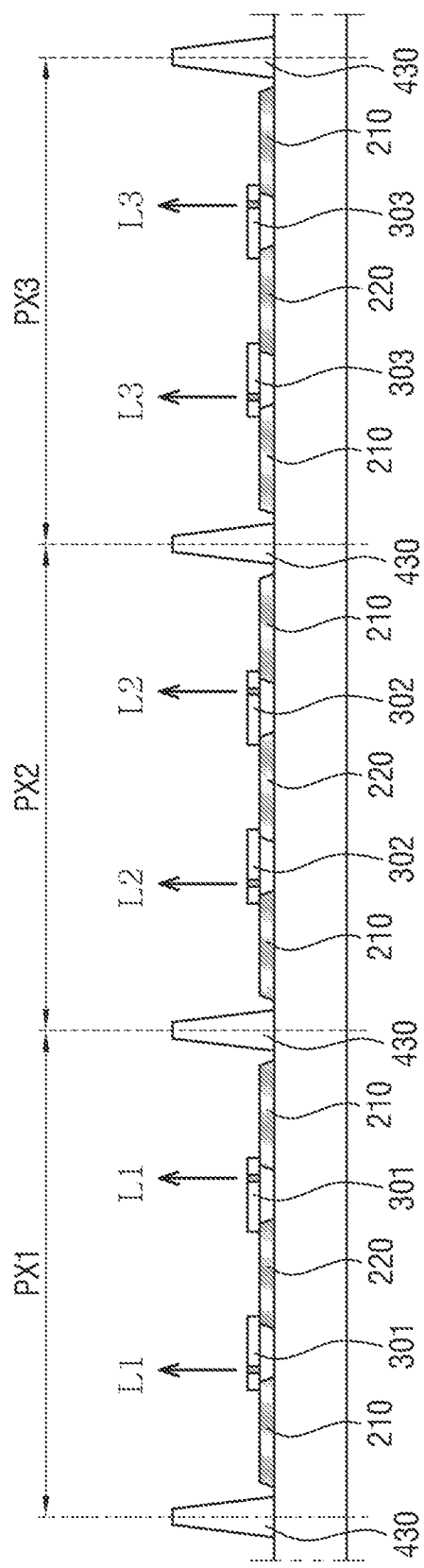
FIG. 21 is a schematic cross-sectional view of the display device according to one or more embodiments.

FIG. 21 is a schematic cross-sectional view of the display device according to one or more embodiments.

Referring to FIG. 21, the display device 10 may include the first light emitting elements 301 disposed in the first subpixel PX1, the second light emitting elements 302 disposed in the second subpixel PX2, and the third light emitting elements 303 disposed in the third subpixel PX3.

Each of the first light emitting elements 301 may include an active layer 330 emitting first light L1 whose central wavelength band is a first wavelength, but wavelength conversion materials 385 may not be disposed on an insulating film 380. That is, in each of the first light emitting elements 301, light emitted from the active layer 330 may be emitted out of the first light emitting element 301 without being converted by the wavelength conversion materials 385. However, the present disclosure is not limited thereto, and scatterers 386 may be disposed on the insulating film 380 of each of the first light emitting elements 301. Accordingly, the first light L1 of the first light emitting elements 301 may be output from the first subpixel PX1.

Each of the second light emitting elements 302 may include an active layer 330 emitting the first light L1 but may include first wavelength conversion materials disposed on an insulating film 380 and converting the first light L1 into second light L2 whose central wavelength band is a second wavelength different from the first wavelength. In each of the second light emitting elements 302, the first light L1 emitted from the active layer 330 may be incident on the first wavelength conversion materials and converted into the second light L2 and then may be emitted out of the second light emitting element 302. Accordingly, the second light L2 of the second light emitting elements 302 may be output from the second subpixel PX2.

Each of the third light emitting elements 303 may include an active layer 330 emitting the first light L1 but may include second wavelength conversion materials disposed on an insulating film 380 and converting the first light L1 into third light L3 whose central wavelength band is a third wavelength different from the first wavelength and the second wavelength. In each of the third light emitting elements 303, the first light L1 emitted from the active layer 330 may be incident on the second wavelength conversion materials and converted into the third light L3 and then may be emitted out of the third light emitting element 303. Accordingly, the third light L3 of the third light emitting elements 303 may be output from the third subpixel PX3. In one or more embodiments, the first wavelength conversion materials and the second wavelength conversion materials may each be composed of quantum dots. In this case, a particle size of quantum dots constituting the first wavelength conversion materials may be different from a size of quantum dots constituting the second wavelength conversion materials, but the present disclosure is not limited thereto.

The display device 10 according to one or more embodiments may include the first light emitting elements 301, the second light emitting elements 302, and the third light emitting elements 303 that include the active layers 330 emitting the same light but emit different light to the outside. The first light emitting elements 301, the second light emitting elements 302, and the third light emitting elements 303 may each include the active layer 330 emitting the first light L1, convert the first light L1 into the second light L2 or the third light L3 through the wavelength conversion materials 385 disposed on the insulating film 380, and emit the second light L2 or the third light L3. Accordingly, the display device 10 may display light of various colors using the light emitting elements 300 including the same active layer 330 by changing the type of the wavelength conversion materials 385 disposed on the insulating film 380.

In one or more embodiments, the first light L1 may be blue light whose central wavelength band is in the range of 450 to 495 nm, the second light L2 may be green light whose central wavelength band is in the range of 495 to 570 nm, and the third light L3 may be red light whose central wavelength band is in the range of 620 to 752 nm. However, the present disclosure is not limited thereto. The first light L1, the second light L2, and the third light L3 may be light of different colors or may be light of the same color, and their central wavelength bands may also be different from the above ranges.

In addition, the display device 10 may include a first insulating layer 510 which at least partially covers the first electrode 210 and the second electrode 220 (e.g., see FIG. 22).

The first insulating layer 510 may be disposed in each subpixel PXn of the display device 10. The first insulating layer 510 may substantially entirely cover each subpixel PXn and may extend to other neighboring subpixels PXn. The first insulating layer 510 may at least partially cover the first electrode 210 and the second electrode 220. In one or more embodiments, the first insulating layer 510 may be disposed to partially expose the first electrode 210 and the second electrode 220, for example, partially expose the first electrode branch portion 210B and the second electrode branch portion 220B.

In addition to the first insulating layer 510, the display device 10 may include the circuit element layer PAL located under each of the electrodes 210 and 220 and a second insulating layer 520 (see FIG. 22) and a passivation layer 550 (see FIG. 22) at least partially covering each electrode 210 or 220 and the light emitting elements 300. The structure of the display device 10 will now be described in detail with reference to FIG. 22.

FIG. 22 is a cross-sectional view taken along the lines Xa-Xa', Xb-Xb' and Xc-Xc' of FIG. 20.

FIG. 22 illustrates a cross section of only the second subpixel PX2, but the same illustration may be applied to other pixels PX or subpixels PXn. FIG. 22 illustrates a cross section across an end and the other end of a light emitting element 300.

Referring to FIGS. 20 and 22, the display device 10 may include the circuit element layer PAL and a light emitting layer EML. The circuit element layer PAL may include a substrate 110, a buffer layer 115, light blocking layers BML, first and second transistors 120 and 140, etc., and the light emitting layer EML may include a plurality of electrodes 210 and 220, light emitting elements 300, a plurality of insulating layers 510, 520, and 550, etc. disposed on the first and second transistors 120 and 140.

The substrate 110 may be an insulating substrate. The substrate 110 may be made of an insulating material such as glass, quartz, or polymer resin. In addition, the substrate 110 may be a rigid substrate, but may also be a flexible substrate that can be bent, folded, rolled, etc.

The light blocking layers BML may be disposed on the substrate 110. The light blocking layers BML may include a first light blocking layer BML1 and a second light blocking layer BML2. The first light blocking layer BML1 may be electrically connected to a first drain electrode 123 of the first transistor 120 which will be described later. The second light blocking layer BML2 may be electrically connected to a second drain electrode 143 of the second transistor 140.

The first light blocking layer BML1 and the second light blocking layer BML2 are overlapped by a first active material layer 126 of the first transistor 120 and a second active material layer 146 of the second transistor 140, respectively, in the thickness direction of the substrate 110. The first and second light blocking layers BML1 and BML2 may include a light blocking material to prevent light from entering the first and second active material layers 126 and 146. For example, the first and second light blocking layers BML1 and BML2 may be made of an opaque metal material that blocks transmission of light. However, the present disclosure is not limited thereto. In some cases, the light blocking layers BML may be omitted.

The buffer layer 115 is disposed on the light blocking layers BML and the substrate 110. The buffer layer 115 may entirely cover the substrate 110 as well as the light blocking layers BML. The buffer layer 115 may prevent diffusion of impurity ions, prevent penetration of moisture or outside air, and perform a surface planarization function. In addition, the buffer layer 115 may insulate the light blocking layers BML and the first and second active material layers 126 and 146 from each other.

A semiconductor layer is disposed on the buffer layer 115. The semiconductor layer may include the first active material layer 126 of the first transistor 120, the second active material layer 146 of the second transistor 140, and an auxiliary layer 163. The semiconductor layer may include polycrystalline silicon, monocrystalline silicon, an oxide semiconductor, or the like.

The first active material layer 126 may include a first doped region 126*a*, a second doped region 126*b*, and a first channel region 126*c*. The first channel region 126*c* may be disposed between the first doped region 126*a* and the second doped region 126*b*. The second active material layer 146 may include a third doped region 146*a*, a fourth doped region 146*b*, and a second channel region 146*c*. The second channel region 146*c* may be disposed between the third doped region 146*a* and the fourth doped region 146*b*. The first active material layer 126 and the second active material layer 146 may include polycrystalline silicon. The polycrystalline silicon may be formed by crystalizing amorphous silicon. Examples of the crystallization method may include, but are not limited to, a rapid thermal annealing (RTA) method, a solid phase crystallization (SPC) method, an excimer laser annealing (ELA) method, a metal induced crystallization (MILC) method, and a sequential lateral solidification (SLS) method. Alternatively, the first active material layer 126 and the second active material layer 146 may include monocrystalline silicon, amorphous silicon, or the like. The first doped region 126*a*, the second doped region 126*b*, the third doped region 146*a*, and the fourth doped region 146*b* may be regions of the first active material layer 126 and the second active material layer 146 that are doped with impurities. However, the present disclosure is not limited thereto.

A first gate insulating layer 150 is disposed on the semiconductor layer.

The first gate insulating layer 150 may entirely cover the buffer layer 115 as well as the semiconductor layer (e.g., the first active material layer 126 of the first transistor 120, the second active material layer 146 of the second transistor 140, and the auxiliary layer 163). The first gate insulating layer 150 may function as a gate insulating layer of each of the first and second transistors 120 and 140.

A first conductive layer is disposed on the first gate insulating layer 150. The first conductive layer disposed on the first gate insulating layer 150 may include a first gate electrode 121 disposed on the first active material layer 126 of the first transistor 120, a second gate electrode 141 disposed on the second active material layer 146 of the second transistor 140, and a power wiring 161 disposed on the auxiliary layer 163. The first gate electrode 121 may overlap the first channel region 126*c* of the first active material layer 126 in the thickness direction of the substrate 110, and the second gate electrode 141 may overlap the second channel region 146*c* of the second active material layer 146 in the thickness direction of the substrate 110, and the power wiring 161 may overlap the auxiliary layer 163 in the thickness direction of the substrate 110.

An interlayer insulating film 170 is disposed on the first conductive layer (e.g., the first gate electrode 121, the second gate electrode 141, and the power wiring 161). The interlayer insulating film 170 may function as an interlayer insulating film. In addition, the interlayer insulating film 170 may include an organic insulating material and perform a surface planarization function.

A second conductive layer is disposed on the interlayer insulating film 170. The second conductive layer includes the first drain electrode 123 and a first source electrode 124 of the first transistor 120, the second drain electrode 143 and a second source electrode 144 of the second transistor 140, and a power electrode 162 disposed on the power wiring 161.

The first drain electrode 123 and the first source electrode 124 may respectively contact the first doped region 126*a* and the second doped region 126*b* of the first active material layer 126 through respective contact holes penetrating the interlayer insulating film 170 and the first gate insulating layer 150. The second drain electrode 143 and the second source electrode 144 may respectively contact the third doped region 146*a* and the fourth doped region 146*b* of the second active material layer 146 through respective contact holes penetrating the interlayer insulating film 170 and the first gate insulating layer 150. In addition, the first drain electrode 123 and the second drain electrode 143 may be electrically connected to the first light blocking layer BML1 and the second light blocking layer BML2, respectively, through respective contact holes penetrating the interlayer insulating film 170, the first gate insulating layer 150, and the buffer layer 115.

A via layer 200 is disposed on the second conductive layer. The via layer 200 may include an organic insulating material and perform a surface planarization function.

A plurality of banks 410, 420, and 430, a plurality of electrodes 210 and 220, and the light emitting elements 300 may be disposed on the via layer 200.

The banks 410, 420, and 430 may include the inner banks 410 and 420 spaced from each other in each subpixel PXn and the outer bank 430 disposed at the boundary between neighboring subpixels PXn.

When ink in which the light emitting elements 300 are dispersed is sprayed using an inkjet printing device during the manufacture of the display device 10, the outer bank 430 may prevent the ink from flowing over the boundary of a subpixel PXn. However, the present disclosure is not limited thereto.

The inner banks 410 and 420 may include the first inner bank 410 and the second inner bank 420 disposed adjacent to the center of each subpixel PXn.

The first inner bank 410 and the second inner bank 420 are spaced to face each other. The first electrode 210 may be disposed on the first inner bank 410, and the second electrode 220 may be disposed on the second inner bank 420. It may be understood from FIGS. 20 and 22 that the first electrode branch portion 210B is disposed on the first inner bank 410 and the second electrode branch portion 220B is disposed on the second inner bank 420.

The first inner bank 410 and the second inner bank 420 may extend in the second direction DR2 in each subpixel PXn. Although not illustrated in the drawings, the first inner bank 410 and the second inner bank 420 may extend in the second direction DR2 toward a subpixel PXn neighboring in the second direction DR2. However, the present disclosure is not limited thereto, and the first inner bank 410 and the second inner bank 420 may be disposed in each subpixel PXn to form patterns in the entire display device 10. The banks 410, 420, and 430 may include polyimide (PI), but the present disclosure is not limited thereto.

At least a portion of each of the first inner bank 410 and the second inner bank 420 may protrude from the via layer 200. Each of the first inner bank 410 and the second inner bank 420 may protrude upward from a plane in which the light emitting elements 300 are disposed, and the protruding portion may be at least partially inclined. The protruding shape of each of the first inner bank 410 and the second inner bank is not particularly limited.

The electrodes 210 and 220 may be disposed on the via layer 200 and the inner banks 410 and 420. As described above, each of the electrodes 210 and 220 includes the electrode stem portion 210S or 220S and the electrode branch portion 210B or 220B. The line Xa-Xa' of FIG. 20 is a line crossing the first electrode stem portion 210S, the line Xb-Xb' of FIG. 20 is a line crossing the first electrode branch portion 210B and the second electrode branch portion 220B, and the line Xc-Xc' of FIG. 20 is a line crossing the second electrode stem portion 220S. That is, it may be understood that the first electrode 210 disposed in the area Xa-Xa' of FIG. 22 is the first electrode stem portion 210S, the first electrode 210 and the second electrode 220 disposed in the area Xb-Xb' of FIG. 22 are the first electrode branch portion 210B and the second electrode branch portion 220B, respectively, and the second electrode 220 disposed in the area Xc-Xc' of FIG. 22 is the second electrode stem portion 220S. The electrode stem portions 210S and 220S and the electrode branch portions 210B and 220B may form the first electrode 210 and the second electrode 220, respectively.

Each of the first electrode 210 and the second electrode 220 may have a portion disposed on the via layer 200 and a portion disposed on the first inner bank 410 or the second inner bank 420. As described above, the first electrode stem portion 210S of the first electrode 210 and the second electrode stem portion 220S of the second electrode 220 may extend in the first direction DR1, and the first inner bank 410 and the second inner bank 420 may extend in the second direction DR2 to also lie in a subpixel PXn neighboring in the second direction DR2. In one or more embodiments, the first electrode stem portion 210S and the second electrode stem portion 220S of the first electrode 210 and the second electrode 220 that extend in the first direction DR1 may partially overlap the first inner bank 410 and the second inner bank 420. However, the present disclosure is not limited thereto, and the first electrode stem portion 210S and the second electrode stem portion 220S may also not overlap the first inner bank 410 and the second inner bank 420.

The first electrode contact hole CNDT penetrating the via layer 200 to expose a portion of the first drain electrode 123 of the first transistor 120 may be formed in the first electrode stem portion 210S of the first electrode 210. The first electrode 210 may contact the first drain electrode 123 through the first electrode contact hole CNTD. The first electrode 210 may be electrically connected to the first drain electrode 123 of the first transistor 120 to receive an electrical signal (e.g., a predetermined electrical signal) from the first transistor 120.

The second electrode stem portion 220S of the second electrode 220 may extend in a direction to also lie in the non-emission area in which the light emitting elements 300 are not disposed. The second electrode contact hole CNTS penetrating the via layer 200 to expose a portion of the power electrode 162 may be formed in the second electrode stem portion 220S. The second electrode 220 may contact the power electrode 162 through the second electrode contact hole CNTS. The second electrode 220 may be electrically connected to the power electrode 162 to receive an electrical signal (e.g., a predetermined electrical signal) from the power electrode 162.

Portions of the first electrode 210 and the second electrode 220, for example, the first electrode branch portion 210B and the second electrode branch portion 220B may be disposed on the first inner bank 410 and the second inner bank 420, respectively. The first electrode branch portion 210B of the first electrode 210 may cover the first inner bank 410, and the second electrode branch portion 220B of the second electrode 220 may cover the second inner bank 420. Because the first inner bank 410 and the second inner bank 420 are spaced from each other in the center of each subpixel PXn, the first electrode branch portion 210B and the second electrode branch portion 220B may also be spaced from each other. A plurality of light emitting elements 300 may be disposed in an area between the first electrode 210 and the second electrode 220, that is, in a space in which the first electrode branch portion 210B and the second electrode branch portion 220B are spaced from each other and face each other.

Each of the electrodes 210 and 220 may include a transparent conductive material. For example, each of the electrodes 210 and 220 may include a material such as indium tin oxide (ITO), indium zinc oxide (IZO), or indium tin zinc oxide (ITZO). However, the present disclosure is not limited thereto. In one or more embodiments, each of the electrodes 210 and 220 may include a conductive material having high reflectivity. For example, each of the electrodes 210 and 220 may include a metal such as silver (Ag), copper (Cu) or aluminum (Al) as a material having high reflectivity. In this case, each of the electrodes 210 and 220 may reflect incident light in the upward direction of each subpixel PXn.

In addition, each of the electrodes 210 and 220 may have a structure in which a transparent conductive material and a metal layer having high reflectivity are each stacked in one or more layers or may be formed as a single layer including them. In one or more embodiments, each of the electrodes 210 and 220 may have a stacked structure of ITO/Ag/ITO/IZO or may be an alloy containing aluminum (Al), nickel (Ni), lanthanum (La), etc. However, the present disclosure is not limited thereto.

The first insulating layer 510 is disposed on via layer 200, the first electrode 210, and the second electrode 220. The first insulating layer 510 partially covers the first electrode 210 and the second electrode 220. The first insulating layer 510 may cover most of upper surfaces of the first electrode 210 and the second electrode 220 but may partially expose the first electrode 210 and the second electrode 220. The first insulating layer 510 may partially expose the upper surfaces of the first electrode 210 and the second electrode 220, for example, partially expose an upper surface of the first electrode branch portion 210B disposed on the first inner bank 410 and an upper surface of the second electrode branch portion 220B disposed on the second inner bank 420. That is, the first insulating layer 510 may be substantially entirely formed on the via layer 200 but may include openings partially exposing the first electrode 210 and the second electrode 220. The openings of the first insulating layer 510 may be positioned to expose the relatively flat upper surfaces of the first electrode 210 and the second electrode 220.

In one or more embodiments, the first insulating layer 510 may be stepped such that a portion of an upper surface of the first insulating layer 510 is depressed between the first electrode 210 and the second electrode 220. In one or more embodiments, the first insulating layer 510 may include an inorganic insulating material, and a portion of the upper surface of the first insulating layer 510 disposed to cover the first electrode 210 and the second electrode 220 may be depressed due to a step formed by the members disposed under the first insulating layer 510. The light emitting elements 300 disposed on the first insulating layer 510 between the first electrode 210 and the second electrode 220 may form an empty space with the depressed upper surface of the first insulating layer 510. The light emitting elements 300 may be partially spaced from the upper surface of the first insulating layer 510, and the empty space may be filled with a material that forms the second insulating layer 520 to be described later.

However, the present disclosure is not limited thereto. The first insulating layer 510 may also form a flat upper surface so that the light emitting elements 300 can be disposed on the flat upper surface. The upper surface may extend in a direction toward the first electrode 210 and the second electrode 220 and may end on inclined side surfaces of the first electrode 210 and the second electrode 220. That is, the first insulating layer 510 may be disposed in areas where the electrodes 210 and 220 overlap inclined side surfaces of the first inner bank 410 and the second inner bank 420, respectively. Contact electrodes 260 to be described later may contact the exposed areas of the first electrode 210 and the second electrode 220 and may smoothly contact ends of the light emitting elements 300 on the flat upper surface of the first insulating layer 510.

The first insulating layer 510 may protect the first electrode 210 and the second electrode 220 while insulating them from each other. In addition, the first insulating layer 510 may prevent the light emitting elements 300 disposed on the first insulating layer 510 from directly contacting other members and thus being damaged. However, the shape and structure of the first insulating layer 510 are not limited thereto.

The light emitting elements 300 may be disposed on the first insulating layer 510 between the electrodes 210 and 220. For example, at least one light emitting element 300 may be disposed on the first insulating layer 510 disposed between the electrode branch portions 210B and 220B. However, the present disclosure is not limited thereto, and although not illustrated in the drawings, at least some of the light emitting elements 300 disposed in each subpixel PXn may also be disposed in an area other than the area between the electrode branch portions 210B and 220B. In addition, the light emitting elements 300 may be disposed at a position where a portion of each light emitting element 300 overlaps the electrodes 210 and 220. The light emitting elements 300 may be disposed on respective ends of the first electrode branch portion 210B and the second electrode branch portion 220B that face each other and may be electrically connected to the electrodes 210 and 220 through the contact electrodes 260, respectively.

As described above, in each subpixel PXn, the light emitting elements 300 that include the active layers 330 emitting light L having the same wavelength but emit light L1 through L3 of different wavelengths according to the wavelength conversion materials 385 or the scatterers 386 disposed on the insulating films 380 may be disposed. Although only the first subpixel PX1 in which the first light emitting elements 301 are disposed is illustrated in the drawings, the same illustration may be applied to the second subpixel PX2 and the third subpixel PX3.

In addition, in each of the light emitting elements 300, a plurality of layers may be disposed in a direction horizontal to the via layer 200. Each of the light emitting elements 300 of the display device 10 according to one or more embodiments may include a first semiconductor layer 310, a second semiconductor layer 320, and the active layer 330, and these layers may be sequentially disposed in the direction horizontal to the via layer 200. However, the present disclosure is not limited thereto, and the order in which the layers of each light emitting element 300 are disposed may also be in an opposite direction. In some cases, when the light emitting elements 300 have a different structure, the layers may be disposed in a direction perpendicular to the via layer 200.

The second insulating layer 520 may be disposed on a portion of each light emitting element 300. The second insulating layer 520 may partially cover an outer surface (e.g., an outer peripheral or circumferential surface) of each light emitting element 300. The second insulating layer 520 may protect the light emitting elements 300 while fixing the light emitting elements 300 in the process of manufacturing the display device 10. In addition, in one or more embodiments, a portion of the material of the second insulating layer 520 may be disposed between lower surfaces of the light emitting elements 300 and the first insulating layer 510. As described above, the second insulating layer 520 may be formed to fill the space between the first insulating layer 510 and the light emitting elements 300 formed during the process of manufacturing the display device 10. Accordingly, the second insulating layer 520 may be formed to cover the outer surface (e.g., the outer peripheral or circumferential surface) of each light emitting element 300. However, the present disclosure is not limited thereto.

The second insulating layer 520 may extend in the second direction DR2 between the first electrode branch portion 210B and the second electrode branch portion 220B in a plan view. For example, the second insulating layer 520 may have an island or linear shape on the via layer 200 in a plan view.

The contact electrodes 260 are disposed on the electrodes 210 and 220 and the second insulating layer 520. A first contact electrode 261 and a second contact electrode 262 may be spaced from each other on the second insulating layer 520. The second insulating layer 520 may insulate the first contact electrode 261 and the second contact electrode 262 from each other to prevent them from directly contacting each other.

Although not illustrated in the drawings, a plurality of contact electrodes 260 may extend in the second direction DR2 in a plan view and may be spaced from each other in the first direction DR1. Each of the contact electrodes 260 may contact at least one end of each light emitting element 300 and may be electrically connected to the first electrode 210 or the second electrode 220 to receive an electrical signal. The contact electrodes 260 may include the first contact electrode 261 and the second contact electrode 262. The first contact electrode 261 may be disposed on the first electrode branch portion 210B and may contact an end of each light emitting element 300, and the second contact electrode 262 may be disposed on the second electrode branch portion 220B and may contact the other end of each light emitting element 300.

The first contact electrode 261 may contact an exposed area of the first electrode 210 on the first inner bank 410, and the second contact electrode 262 may contact an exposed area of the second electrode 220 on the second inner bank 420. The contact electrodes 260 may send an electrical signal received from each electrode 210 or 220 to the light emitting elements 300.

The contact electrodes 260 may include a conductive material such as ITO, IZO, ITZO, or aluminum (Al). However, the present disclosure is not limited thereto.

The passivation layer 550 may be disposed on the first contact electrode 261, the second contact electrode 262, and the second insulating layer 520. The passivation layer 550 may function to protect members disposed on the via layer 200 from the external environment.

Each of the first insulating layer 510, the second insulating layer 520, and the passivation layer 550 described above may include an inorganic insulating material or an organic insulating material. In one or more embodiments, the first insulating layer 510, the second insulating layer 520, and the passivation layer 550 may include an inorganic insulating material such as silicon oxide (SiOx), silicon nitride (SiNx), silicon oxynitride (SiOxNy), aluminum oxide ($Al_2O_3$), or aluminum nitride (AlN). Alternatively, the first insulating layer 510, the second insulating layer 520, and the passivation layer 550 may include an organic insulating material such as acrylic resin, epoxy resin, phenolic resin, polyamide resin, polyimide resin, unsaturated polyester resin, polyphenylene resin, polyphenylene sulfide resin, benzocyclobutene, cardo resin, siloxane resin, silsesquioxane resin, polymethyl methacrylate, polycarbonate, or polymethyl methacrylate-polycarbonate synthetic resin. However, the present disclosure is not limited thereto.

The display device 10 may include a larger number of insulating layers. According to one or more embodiments, the display device 10 may further include a third insulating layer 530 disposed to protect the first contact electrode 261.

FIG. 23 is a cross-sectional view of a display device according to one or more embodiments.

Referring to FIG. 23, a display device 10_1 according to one or more embodiments may further include a third insulating layer 530_1 disposed on a first contact electrode 261_1. The display device 10_1 according to the current embodiment is different from the display device 10 of FIG. 22 in that it further includes the third insulating layer 530_1 and thus at least a portion of a second contact electrode 262_1 is disposed on the third insulating layer 530_1. Therefore, any redundant description will be omitted below, and differences will be mainly described.

The display device 10_1 of FIG. 23 may include the third insulating layer 530_1 that is disposed on the first contact electrode 261_1 and electrically insulates the first contact electrode 261_1 and the second contact electrode 262_1 from each other. The third insulating layer 530_1 may cover the first contact electrode 261_1 but may not overlap a portion of each light emitting element 300 so that the light emitting element 300 may be connected to the second contact electrode 262_1. The third insulating layer 5301 may partially contact the first contact electrode 261_1 and a second insulating layer 520_1 on an upper surface of the second insulating layer 520_1. The third insulating layer 5301 may cover an end of the first contact electrode 261_1 on the second insulating layer 520_1. Accordingly, the third insulating layer 5301 may protect the first contact electrode 261_1 while electrically insulating the first contact electrode 261_1 from the second contact electrode 262_1.

A side surface of the third insulating layer 530_1 in a direction in which the second contact electrode 262_1 is disposed may be aligned with a side surface of the second insulating layer 520_1. However, the present disclosure is not limited thereto. In one or more embodiments, the third insulating layer 5301 may include an inorganic insulating material, like a first insulating layer 510.

The first contact electrode 2611 may be disposed between a first electrode 210_1 and the third insulating layer 530_1, and the second contact electrode 262_1 may be disposed on the third insulating layer 530_1. The second contact electrode 262_1 may partially contact the first insulating layer 510_1, the second insulating layer 520_1, the third insulating layer 530_1, a second electrode 220_1, and the light emitting elements 300. An end of the second contact electrode 262_1 in a direction in which the first electrode 210_1 is disposed may be disposed on the third insulating layer 530_1.

A passivation layer 550_1 may be disposed on the third insulating layer 530_1 and the second contact electrode 262_1 to protect them. A redundant description will be omitted below.

In the display device 10, the first electrode 210 and the second electrode 220 may not necessarily extend in one direction. The first electrode 210 and the second electrode 220 of the display device 10 are not limited to a particular shape as long as they are spaced from each other to provide a space in which the light emitting elements 300 are disposed.

Figure 24:
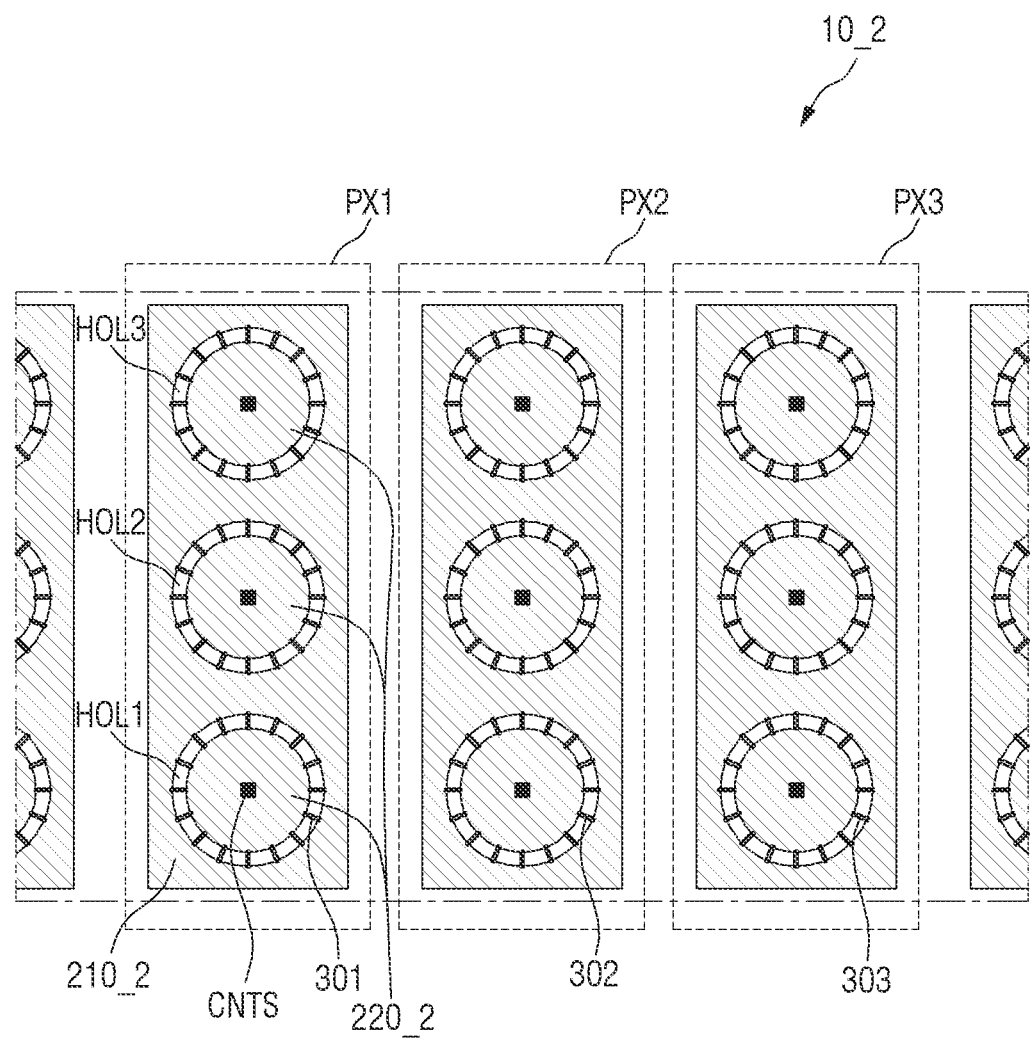
FIG. 24 is a plan view of a pixel of a display device according to one or more embodiments.

FIG. 24 is a plan view of a pixel of a display device according to one or more embodiments.

Referring to FIG. 24, a first electrode 210_2 and a second electrode 220_2 of a display device 10_2 according to one or more embodiments may be at least partially curved, and a curved area of the first electrode 210_2 and a curved area of the second electrode 2202 may be spaced from each other and face each other. The display device 10_2 according to the current embodiment is different from the display device 10 of FIG. 20 in the shape of each of the first electrode 210_2 and the second electrode 220_2. Therefore, any redundant description will be omitted below, and differences will be mainly described.

The first electrode 210_2 of the display device 10_2 of FIG. 24 may include a plurality of holes HOL. For example, as illustrated in the drawing, the first electrode 2102 may include a first hole HOL1, a second hole HOL2, and a third hole HOL3 arranged along the second direction DR2. However, the present disclosure is not limited thereto, and the first electrode 2102 may include a larger or smaller number of holes HOL or may include only one hole HOL. A case where the first electrode 210_2 includes the first hole HOL1, the second hole HOL2, and the third hole HOL3 will be described below as an example.

In one or more embodiments, each of the first hole HOL1, the second hole HOL2, and the third hole HOL3 may have a circular planar shape. Accordingly, the first electrode 210_2 may include a curved area formed by each of the holes HOL and may face the second electrode 220_2 in the curved area. However, this is merely an example, and the present disclosure is not limited thereto. Each of the first hole HOL1, the second hole HOL2, and the third hole HOL3 is not limited to a particular shape as long as it can provide a space in which the second electrode 220_2 is disposed as will be described later and may have various planar shapes such as an elliptical shape and a quadrangular or more polygonal shape.

The second electrode 220_2 may be provided in plural numbers in each subpixel PXn. For example, three second electrodes 2202 may be disposed in each subpixel PXn to correspond to the first through third holes HOL1 through HOL3 of the first electrode 210_2. The second electrode 2202 may be located in each of the first through third holes HOL1 through HOL3 and may be surrounded by the first electrode 210_2.

In one or more embodiments, the holes HOL of the first electrode 210_2 may have curved outer surfaces, and the second electrodes 220_2 disposed in the holes HOL of the first electrode 210_2 may have curved outer surfaces and may be spaced from the first electrode 210_2 to face the first electrode 210_2. As illustrated in FIG. 24, the first electrode 210_2 may include the holes HOL having a circular shape in a plan view, and the second electrodes 2202 may have a circular shape in a plan view. The curved surfaces of the areas in which the holes HOL of the first electrode 210_2 are formed may be spaced from the curved outer surfaces of the second electrodes 220_2 to face them. For example, the first electrode 2102 may surround the outer surfaces of the second electrodes 220_2.

As described above, light emitting elements 300 may be disposed between the first electrode 210_2 and the second electrodes 220_2. The display device 10_2 according to the current embodiment may include the second electrodes 220_2 having a circular shape and the first electrode 210_2 surrounding the second electrodes 2202, and the light emitting elements 300 may be arranged along the outer surfaces of the second electrodes 220_2. Because the light emitting elements 300 extend in one direction as described above, the light emitting elements 300 arranged along the curved outer surfaces of the second electrodes 220_2 in each subpixel PXn may be disposed such that their extending directions face different directions. Each subpixel PXn may have various light exit directions according to the direction in which the extending directions of the light emitting elements 300 face. In the display device 10_2 according to the current embodiment, because the first electrode 210_2 and the second electrode 220_2 are disposed to have a curved shape, the light emitting elements 300 disposed between them may face different directions, and lateral visibility of the display device 10_2 may be improved.

Figure 25:
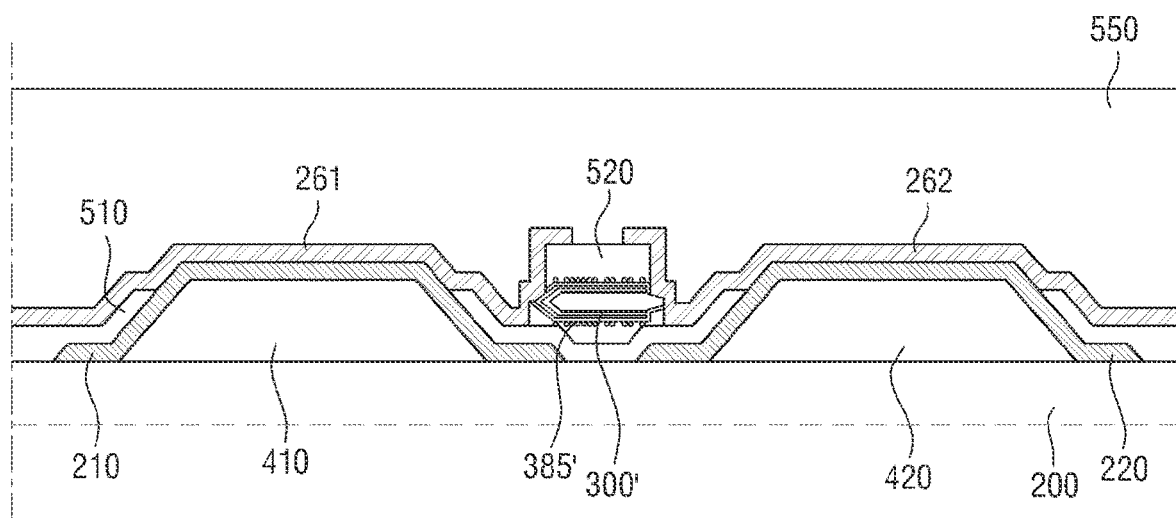
FIG. 25 is a cross-sectional view of a portion of a display device including the light emitting element of FIG. 18.

FIG. 25 is a cross-sectional view of a portion of a display device including the light emitting element of FIG. 18.

FIG. 25 illustrates a portion of Xb-Xb' of FIG. 22 in the display device 10 including the light emitting element 300' of FIG. 18. The display device 10 of FIG. 25 is the same as the display device 10 of FIG. 22 except for the structure of the light emitting element 300'. Therefore, any redundant description will be omitted below, and differences will be mainly described.

As described above, the light emitting element 300' may include a plurality of layers and may be disposed between a first electrode 210 and a second electrode 220. The layers of the light emitting element 300' may be disposed in a direction horizontal to a via layer 200. According to one or more embodiments, the light emitting element 300' may be disposed such that a direction in which the body of the first semiconductor layer 310' extends is parallel to the via layer 200. In the light emitting element 300' disposed on a first insulating layer 510, the insulating film 380', the electrode layer 370', the second semiconductor layer 320', the active layer 330', and the first semiconductor layer 310' may be sequentially disposed in a direction perpendicular to the via layer 200. In addition, because each layer of the light emitting element 300' is around (or surrounds) outer surfaces of other layers, the light emitting element 300' disposed in the display device 10 may have a symmetrical structure with respect to the first semiconductor layer 310'. That is, the active layer 330', the second semiconductor layer 320', the electrode layer 370', and the insulating film 380' may be sequentially stacked from the first semiconductor layer 310' along the direction perpendicular to the via layer 200'. However, the present disclosure is not limited thereto. The order in which the layers of the light emitting element 300' are disposed may also be in an opposite direction. In some cases, when the light emitting layer 300' has a different structure, the layers may be disposed in the direction horizontal to the via layer 200.

For example, in the light emitting element 300' of FIG. 18, wavelength conversion materials 385' may be disposed on the insulating film 380' along the area in which active layer 330' is disposed. Most of the area in which the wavelength conversion materials 385' are disposed may overlap the active layer 330'. Accordingly, most of light L generated from the active layer 330' may be incident on the wavelength conversion materials 385', and the amount of light converted by the wavelength conversion materials 385' may be increased.

In the display device 10 of FIG. 25, a portion of the insulating film 380' of the light emitting element 300' may be removed, and the electrode layer 370' and the first semiconductor layer 310' may be partially exposed. During a manufacturing process of the display device 10, the insulating film 380 may be partially removed when a second insulating layer 520 is formed. An exposed area of the electrode layer 370' may contact a first contact electrode 261, and an exposed area of the first semiconductor layer 310' may contact a second contact electrode 262.

In addition, the light emitting element 300' may include, based on the body, a first end having inclined side surfaces and a second end extending with a smaller width than the body. In the light emitting element 300' disposed on the first insulating layer 510, side surfaces of the body may partially contact the first insulating layer 510, and the first end and the second end may be spaced from the first insulating layer 510. The second insulating layer 520 may be further disposed in an area in which the body, the first end and the second end of the light emitting element 300 are spaced from the first insulating layer 510. Other elements are the same as those described above and thus will not be described.

In concluding the detailed description, those skilled in the art will appreciate that many variations and modifications can be made to the embodiments without substantially departing from the principles and scope of the present disclosure. Therefore, the embodiments of the present disclosure are used in a generic and descriptive sense only and not for purposes of limitation.

The invention claimed is:

1. A light emitting element comprising:
a first semiconductor layer and a second semiconductor layer;
an active layer between the first semiconductor layer and the second semiconductor layer;
an insulating film around side surfaces of at least the active layer; and
a wavelength conversion material on at least a portion of the insulating film,
wherein light emitted to the outside and light emitted from the active layer have different central wavelength bands.

2. The light emitting element of claim 1, wherein the active layer configured to emit first light whose central wavelength band is a first wavelength, and
wherein the wavelength conversion material is configured to convert the first light into second light whose central wavelength band is a second wavelength.

3. The light emitting element of claim 2, wherein an area in which the wavelength conversion material is located on the insulating film overlaps at least the active layer.

4. The light emitting element of claim 2, wherein the central wavelength band of the first light is in a range of 450 nm to 495 nm, and
wherein the wavelength conversion material comprises a quantum dot material.

5. The light emitting element of claim 4, wherein the central wavelength band of the second light is in a range of 495 nm to 570 nm or 620 nm to 750 nm.

6. The light emitting element of claim 2, wherein the first semiconductor layer, the active layer, and the second semiconductor layer are sequentially located along a first direction, and
wherein at least a portion of light to be emitted from the wavelength conversion material is to travel in a direction different from the first direction.

7. The light emitting element of claim 6, further comprising scatterers located on the insulating film and configured to scatter incident light.

8. The light emitting element of claim 6, further comprising an electrode layer on the second semiconductor layer,
wherein the insulating film is around at least a portion of an outer surface of the electrode layer.

9. The light emitting element of claim 2, further comprising ligand bound to the insulating film,
wherein the wavelength conversion material is bound to the ligand.

10. A display device comprising a first pixel and a second pixel, each of the pixel and the second pixel comprising:
a substrate;
a first electrode on the substrate;
a second electrode on the substrate and spaced from the first electrode; and
one or more light emitting elements between the first electrode and the second electrode,
wherein each of the light emitting elements comprises:
a first semiconductor layer and a second semiconductor layer;
an active layer between the first semiconductor layer and the second semiconductor layer;
an insulating film around side surfaces of at least the active layer; and
a wavelength conversion material on at least a portion of the insulating film, and
wherein the one or more light emitting elements comprises:
a first light emitting element in which light to be emitted from the active layer and light to be emitted out of the light emitting element are the same, and
a second light emitting element in which light to be emitted from the active layer and light to be emitted out of the light emitting element have different central wavelength bands.

11. The display device of claim 10, wherein the active layer of each of the first light emitting element and the second light emitting element is to emit first light whose central wavelength band is a first wavelength,
wherein the first light emitting element is in the first pixel, and
wherein the wavelength conversion material of the second light emitting element comprises a first wavelength conversion and material and the second lighting emitting element is in the second pixel.

12. The display device of claim 11, wherein the central wavelength band of the first light is in a range of 450 nm to 495 nm, and
wherein the wavelength conversion material comprises a quantum dot material.

13. The display device of claim 11, wherein the first wavelength conversion material is to convert the first light into second light whose central wavelength band is a second wavelength different from the first wavelength.

14. The display device of claim 13, wherein each of the first light emitting element and the second light emitting element further comprises scatterers located on the insulating film the scatterers being configured to scatter incident light.

15. The display device of claim 13, further comprising a third pixel,
wherein the one or more light emitting elements further comprise a third light emitting element in the third pixel, the wavelength conversion material of the third light emitting element comprising a second wavelength conversion material.

16. The display device of claim 15, wherein an active layer of the third light emitting element is to emit the first light, and
wherein the second wavelength conversion material is to convert the first light into third light whose central wavelength band is a third wavelength different from the first wavelength and the second wavelength.

* * * * *